(12) United States Patent
Stoessel et al.

(10) Patent No.: US 8,691,400 B2
(45) Date of Patent: Apr. 8, 2014

(54) ELECTRONIC DEVICES COMPRISING METAL COMPLEXES HAVING ISONITRILE LIGANDS

(75) Inventors: Philipp Stoessel, Frankfurt (DE); Holger Heil, Frankfurt (DE); Dominik Joosten, Frankfurt (DE); Christof Pflumm, Frankfurt (DE); Anja Gerhard, Egelsbach (DE)

(73) Assignee: Merck Patent GmbH, Darmstadt (DE)

( * ) Notice: Subject to any disclaimer, the term of this patent is extended or adjusted under 35 U.S.C. 154(b) by 445 days.

(21) Appl. No.: 13/001,640

(22) PCT Filed: Jul. 8, 2009

(86) PCT No.: PCT/EP2009/004955
§ 371 (c)(1),
(2), (4) Date: Dec. 28, 2010

(87) PCT Pub. No.: WO2010/015307
PCT Pub. Date: Feb. 11, 2010

(65) Prior Publication Data
US 2011/0101327 A1      May 5, 2011

(30) Foreign Application Priority Data

Aug. 4, 2008   (DE) .................... 10 2008 036 247

(51) Int. Cl.
*H01L 51/54*     (2006.01)
*C09K 11/06*     (2006.01)

(52) U.S. Cl.
USPC ........... 428/690; 428/917; 313/504; 313/506; 252/301.16; 257/40; 257/102; 257/E51.044; 556/136

(58) Field of Classification Search
None
See application file for complete search history.

(56) References Cited

U.S. PATENT DOCUMENTS

| | | | |
|---|---|---|---|
| 4,539,507 A | 9/1985 | VanSlyke et al. | |
| 5,151,629 A | 9/1992 | VanSlyke | |
| 5,840,217 A | 11/1998 | Lupo et al. | |
| 6,458,909 B1 | 10/2002 | Spreitzer et al. | |
| 7,345,301 B2 | 3/2008 | Gerhard et al. | |
| 7,701,131 B2 | 4/2010 | Gerhard et al. | |
| 7,728,137 B2 | 6/2010 | Stössel et al. | |
| 7,795,801 B2 | 9/2010 | Ueda et al. | |
| 7,816,531 B2 | 10/2010 | Stössel et al. | |
| 7,825,249 B2 | 11/2010 | Stössel et al. | |
| 2002/0134984 A1* | 9/2002 | Igarashi | 257/79 |
| 2003/0218418 A9* | 11/2003 | Sato et al. | 313/504 |
| 2005/0069729 A1 | 3/2005 | Ueda et al. | |
| 2006/0058494 A1 | 3/2006 | Busing et al. | |
| 2006/0220004 A1* | 10/2006 | Stossel et al. | 257/40 |
| 2006/0255332 A1 | 11/2006 | Becker et al. | |
| 2007/0141397 A1 | 6/2007 | Watanabe et al. | |
| 2007/0176147 A1 | 8/2007 | Buesing et al. | |
| 2009/0134384 A1 | 5/2009 | Stoessel et al. | |
| 2009/0167166 A1 | 7/2009 | Bach et al. | |
| 2009/0212280 A1 | 8/2009 | Werner et al. | |
| 2009/0302742 A1 | 12/2009 | Komori et al. | |
| 2009/0302752 A1 | 12/2009 | Parham et al. | |
| 2010/0141120 A1 | 6/2010 | Yersin et al. | |
| 2010/0187977 A1 | 7/2010 | Kai et al. | |
| 2010/0219397 A1 | 9/2010 | Watanabe et al. | |
| 2010/0227978 A1 | 9/2010 | Stoessel et al. | |
| 2010/0244009 A1 | 9/2010 | Parham et al. | |

FOREIGN PATENT DOCUMENTS

| | | |
|---|---|---|
| DE | 102007053771 A1 | 5/2009 |
| DE | 192998017591 A1 | 10/2009 |
| DE | 102008033943 A1 | 1/2010 |
| DE | 102008036982 A1 | 2/2010 |
| EP | 0652273 A1 | 5/1995 |
| EP | 0676461 A2 | 10/1995 |
| EP | 1205527 A1 | 5/2002 |
| EP | 1617710 A1 | 1/2006 |
| EP | 1617711 A1 | 1/2006 |
| EP | 1731584 A1 | 12/2006 |
| JP | 2002-235076 A | 8/2002 |
| JP | 2002-241751 A | 8/2002 |
| JP | 2004-288381 A | 10/2004 |
| JP | 2005-347160 A | 12/2005 |
| JP | 2006-303315 A | 11/2006 |
| WO | WO-98/27136 A1 | 6/1998 |
| WO | WO-2004/037887 A2 | 5/2004 |
| WO | WO-2004/081017 A1 | 9/2004 |
| WO | WO-2004/093207 A2 | 10/2004 |
| WO | WO-2005/003253 A2 | 1/2005 |
| WO | WO-2005/011013 A1 | 2/2005 |
| WO | WO-2005/039246 A1 | 4/2005 |
| WO | WO-2005/086251 A2 | 9/2005 |
| WO | WO-2005/111172 A2 | 11/2005 |
| WO | WO-2005/113563 A1 | 12/2005 |
| WO | WO-2006/008069 A1 | 1/2006 |
| WO | WO-2006/117052 A1 | 11/2006 |
| WO | WO-2007/018067 A1 | 2/2007 |

(Continued)

OTHER PUBLICATIONS

Michelin et al. "Synthesis and metal carbonyl complexes of cis,cis-1,3,5-triisocyclohexane, an unusual tridentate ligand" Inorg. Chem. vol. 19, pp. 3853-3856, 1980.*
Halbauer et al. "Ruthenium complex fragments as constituents of trinuclear photoactive supramolecular assemblies based on hydrogen bond association." Eur. J. Inorg. Chem. 2007, pp. 1508-1514.*
Balch et al. "Ligation-induced changes in metal-metal bonding in luminescent binuclear complexes containing gold(I) and iridium(I)." Inorg. Chem. 1991, vol. 30, pp. 1302-1308.*
Plummer et al., "Synthesis of Chelating Bidentate and Tridentate Cyano Ligands and Their Complexes with Group 7 Metal Carbonyls", *Inorg. Chem.*, vol. 22, pp. 3492-3497 (1983).
Kungi, et al., "A Vapochromic LED," *J. Am. Chem. Soc.*, vol. 120, pp. 589-590 (1998).

(Continued)

*Primary Examiner* — Michael H Wilson
(74) *Attorney, Agent, or Firm* — Novak Druce Connolly Bove + Quigg LLP

(57) ABSTRACT

The present invention relates to electronic devices, in particular organic electroluminescent devices, comprising metal complexes which contain isonitrile ligands.

12 Claims, No Drawings

(56) References Cited

FOREIGN PATENT DOCUMENTS

| WO | WO-2007/063754 A1 | 6/2007 |
|----|-------------------|--------|
| WO | WO-2007/069542 A1 | 6/2007 |
| WO | WO-2007/137725 A1 | 12/2007 |
| WO | WO-2008/003464 A1 | 1/2008 |
| WO | WO-2008/056746 A1 | 5/2008 |
| WO | WO-2008/086851 A1 | 7/2008 |

OTHER PUBLICATIONS

Yamamoto, et al., "Studies on the Interaction of Isocyanides With Transition Metal Complexes. XXVII*. Preparation of Zerovalent Isocyanide Complexes of Chromium, Molybdenum and Tungsten. The Crystal Structure of Hexakis(2,6-Xylyl Isocyanide)Molybdenum Containing Benzene as a Solvated Molecule," *Journal of Organometallic Chemistry*, vol. 282, pp. 191-200 (1985).

* cited by examiner

ELECTRONIC DEVICES COMPRISING METAL COMPLEXES HAVING ISONITRILE LIGANDS

RELATED APPLICATIONS

This application is a national stage application (under 35 U.S.C. §371) of PCT/EP2009/004955, filed Jul. 8, 2009, which claims benefit of German Application No. 10 2008 036 247.6, filed Aug. 4, 2008.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. In recent years, the emitting materials employed have increasingly been organometallic complexes which exhibit phosphorescence instead of fluorescence (M. A. Baldo et al., *Appl. Phys. Lett.* 1999, 75, 4-6). For quantum-mechanical reasons, an up to four-fold increase in energy and power efficiency is possible using organometallic compounds as phosphorescence emitters. In general, however, there is still a need for improvement in OLEDs which exhibit triplet emission. Thus, the physical properties of phosphorescent OLEDs should still be improved with respect to the stability of the metal complexes, the efficiency, operating voltage and lifetime. Further improvements are also desirable in the case of other compounds used in organic electroluminescent devices, such as, for example, matrix materials and charge-transport materials.

In accordance with the prior art, the triplet emitters employed in phosphorescent OLEDs are usually iridium complexes or platinum complexes. An improvement in these OLEDs has been achieved by employing metal complexes with polypodal ligands or cryptates, as a consequence of which the complexes have higher thermal stability, which results in a longer lifetime of the OLEDs (WO 04/081017, WO 05/113563, WO 06/008069). However, further improvements in the complexes are still necessary in order to achieve, in particular, improvements with respect to the efficiency and lifetime of electroluminescent devices which comprise these complexes.

The use of tungsten complexes in OLEDs has also already been described in the literature (JP 2006/303315). However, only tungsten complexes with pyridine ligands, such as, for example, bipyridine or terpyridine, and with phosphine ligands are explicitly disclosed therein.

A property of phosphorescent metal complexes as employed in accordance with the prior art are very long luminescence lifetimes compared with fluorescent compounds. Thus, the phosphorescence lifetimes of iridium complexes at room temperature are usually in the order of 0.5 to 5 µs and those of platinum complexes are in the order of 3 to 30 µs. In particular in the case of passive-matrix addressing of organic electroluminescent devices, this may result in problems since the high luminances necessary here cause saturation of the excited state, meaning that the efficiency drops off considerably at high luminance. Further improvements are thus necessary in this area.

The object of the present invention is therefore to provide novel electronic devices comprising metal complexes as emitters which exhibit red, orange, yellow, green or blue phosphorescence and result in improvements here.

Surprisingly, it has been found that organic electroluminescent devices comprising the metal complexes containing isonitrile ligands described in greater detail achieve this object and result in significant improvements in the organic electroluminescent device, in particular with respect to the operating lifetime and the efficiency at high luminance. The present invention therefore relates to organic electroluminescent devices which comprise these complexes.

The state of the art is organic electroluminescent devices which comprise tetracoordinated metal complexes with isonitrile ligands (WO 08/003,464). However, it is not evident from this disclosure that these complexes exhibit particularly good efficiency and short luminescence lifetimes. In particular, a completely different emission mechanism is observed with these tetracoordinated, planar complexes, where the transitions resulting in emission are based on metal-metal interactions between adjacent complexes. High concentrations of the metal complex are therefore necessary, which is not desirable, in particular in view of the rarity of noble metals.

The synthesis of a tungsten hexaisonitrile complex with monodentate isonitrile ligands is described in Y. Yamamoto et al., J. Organomet. Chem., 1985, 282, 191-200; M. O. Albers et al., J. Chem. Edu., 1986, 63(5), 444-447; and N. J. Coville, 1982, 65, L7-L8. No applications of this complex, in particular applications in electronic devices, are disclosed. Hexacoordinated metal complexes with polydentate isonitrile ligands are also known from the literature (for example F. E. Hahn et al., *J. Organomet. Chem.* 1994, 467, 103-111; F. E. Hahn et al., *J. Organomet. Chem.* 1991, 410, C9-C12; F. E. Hahn et al., *Angew. Chem.* 1992, 104, 1218-1221; F. E. Hahn et al., *Angew. Chem.* 1991, 103, 213-215). However, only general structural chemistry investigations have been carried out with these complexes. The use of such complexes in organic electroluminescent devices is not disclosed.

The invention thus relates to electronic devices comprising at least one metal complex of the formula (1)

formula (1)

where the following applies to the symbols and indices used:

M is a penta- or hexacoordinated transition metal;

L is on each occurrence, identically or differently, a mono-, bi- or tridentate ligand which bonds to the metal M and may be substituted by one or more radicals $R^1$; the ligand L here may also be bonded to the radical R of the isonitrile group;

R is on each occurrence, identically or differently, an organic substituent having 1 to 60 C atoms, which may be substituted by one or more substituents $R^1$; a plurality of radicals R here may also be linked to one another and thus form a polydentate ligand; in addition, the radical R may also be linked to the ligand L;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more, preferably non-adjacent $CH_2$ groups may be replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals R², or a diarylamino group, diheteroarylamino group or arylheteroarylamino group having 10 to 40 aromatic ring atoms, which may be substituted by one or more radicals R², or a combination of these systems; two or more substituents R¹ here may also form a mono- or polycyclic aliphatic, aromatic and/or benzo-fused ring system with one another;

R² is on each occurrence, identically or differently, H, D, F or an aliphatic, aromatic and/or heteroaromatic hydrocarbon radical having 1 to 20 C atoms, in which, in addition, one or more H atoms may be replaced by D or F; two or more substituents R² here may also form a mono- or polycyclic, aliphatic or aromatic ring system with one another;

x is 3, 4, 5 or 6;

y is 0, 1, 2 or 3, with the proviso that a coordination number on the metal of 5 or 6 is achieved.

The indices x and y are selected so that the coordination number on the metal M is in total, depending on the metal, 5 or 6. It is generally known that metal coordination compounds have different coordination numbers, i.e. bond a different number of ligands, depending on the metal atom selected and on the oxidation state of the metal atom. Since the preferred coordination numbers of metals or metal ions in different oxidation states are part of the general expert knowledge of the person skilled in the art in the area of organometallic chemistry or coordination chemistry, it is straightforward for the person skilled in the art to use a suitable number of ligands depending on the metal and its oxidation state and depending on the precise structure of the ligand L, and thus to select the indices x and y suitably.

An electronic device is taken to mean a device which comprises anode, cathode and at least one layer, where this layer comprises at least one organic or organometallic compound. The electronic device according to the invention thus comprises anode, cathode and at least one layer which comprises at least one compound of the formula (1) mentioned above. Preferred electronic devices here are selected from the group consisting of organic electroluminescent devices (=Organic light-emitting diodes, OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) and organic laser diodes (O-lasers), comprising at least one compound of the formula (1) mentioned above in at least one layer. Particular preference is given to organic electroluminescent devices.

The ligands of the C≡N—R type are isonitriles (=isocyanides), which coordinate to the metal via a carbon atom. The ligand here is either monodentate, if R represents a monovalent group, or bidentate, if R represents a divalent group, which either links two isonitrile groups or one isonitrile group and the ligand L to one another, or tridentate, if R represents a trivalent group which links the isonitrile groups and optionally the ligand L to one another. Polydentate ligands are likewise possible if L already represents, for example, a bidentate or tridentate ligand.

For the purposes of this invention, an aryl group contains 6 to 40 C atoms; for the purposes of this invention, a heteroaryl group contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc. For the purposes of this invention, a cyclic carbene is a cyclic group which bonds to the metal via a neutral C atom. The cyclic group here may be saturated or unsaturated. Preference is given here to Arduengo carbenes, i.e. carbenes in which two nitrogen atoms are bonded to the carbene C atom. A five-membered Arduengo carbene ring or another unsaturated five-membered carbene ring is likewise regarded as an aryl group for the purposes of this invention.

For the purposes of this invention, an aromatic ring system contains 6 to 60 C atoms in the ring system. For the purposes of this invention, a heteroaromatic ring system contains 2 to 60 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, an $sp^3$- or $sp^2$-hybridised C, N or O atom or a carbonyl group. Thus, for example, systems such as 9,9'-spirobifluorene, 9,9-diarylfluorene, triarylamine, diaryl ether, stilbene, etc., are also intended to be taken to mean aromatic ring systems for the purposes of this invention, and likewise systems in which two or more aryl groups are interrupted, for example, by a linear or cyclic alkyl, alkenyl or alkynyl group or by a silyl group.

For the purposes of this invention, a cyclic alkyl, alkenyl, alkynyl, alkoxy or thioalkoxy group is taken to mean a monocyclic, bicyclic or polycyclic group.

For the purposes of the present invention, a $C_1$- to $C_{40}$-alkyl group, in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, tert-pentyl, 2-pentyl, cyclopentyl, n-hexyl, s-hexyl, tent-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyt, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and may be linked to the aromatic or heteroaromatic group via any desired positions, is taken to mean, in particular, groups derived from benzene, naphthalene, anthracene, phenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The embodiments of the compound of the formula (1) as preferably used in the electronic device are described below.

Preference is given to compounds of the formula (1), characterised in that they are uncharged, i.e. are electrically neutral. This is achieved in a simple manner in that the charge of the ligands L and of the radical R on the isonitrile ligand is selected so that it compensates for the charge of the complexed metal atom M.

Preference is furthermore given to compounds of the formula (1), characterised in that the sum of the valence electrons around the metal atom is 16 in pentacoordinated complexes and 18 in hexacoordinated complexes. This preference is due to the particular stability of these metal complexes (see, for example, Elschenbroich, Salzer, *Organometallchemie* [Organometallic Chemistry], Teubner Studienbücher, Stuttgart 1993).

Preference is given to compounds of the formula (1) in which M stands for a pentacoordinated or hexacoordinated transition metal, particularly preferably selected from the group consisting of chromium, molybdenum, tungsten, rhenium, ruthenium, osmium, rhodium, iridium, nickel, platinum, copper, silver and gold, in particular molybdenum, tungsten, rhenium, ruthenium, osmium, iridium, platinum and gold. The metals here can be in various oxidation states. Preference is given here to the above-mentioned metals in the oxidation states Cr(0), Cr(II), Cr(III), Cr(IV), Cr(VI), Mo(0), Mo(II), Mo(III), Mo(IV), W(0), W(II), W(III), W(IV), Re(I), Re(II), Re(III), Re(IV), Ru(II), Ru(III), Os(II), Os(III), Os(IV), Rh(I), Rh(III), Ir(I), Ir(III), Ir(IV), Ni(0), Ni(II), Ni(IV), Pt(IV), Cu(I), Cu(II), Cu(III), Ag(II), Au(III) and Au(V); very particular preference is given to Mo(0), W(O), Re(I), Ru(II), Os(II), Rh(III), Ir(III) and Pt(IV).

In a preferred embodiment of the invention, M is a pentacoordinated metal and the index x stands for 3 or 5. In a further preferred embodiment of the invention, M is a hexacoordinated metal and the index x stands for 3, 4 or 6.

In an embodiment of the invention, one or more of the isonitrile ligands are monodentate ligands. In this case, the substituent R preferably stands, identically or differently on each occurrence, for a straight-chain alkyl group having 1 to 20 C atoms or a branched or cyclic alkyl group having 3 to 20 C atoms, each of which may be substituted by one or more radicals $R^1$, where one or more non-adjacent $CH_2$ groups may be replaced by $R^1C=CR^1$, $C\equiv C$, $Si(R^1)_2$, $Ge(R^1)_2$, $Sn(R^1)_2$, $C=O$, $C=S$, $C=Se$, $C=NR^1$, $P(=O)(R^1)$, SO, $SO_2$, $NR^1$, O, S or $CONR^1$ and where one or more H atoms may be replaced by D, F, Cl, Br, I, CN or $NO_2$, or for a monovalent aromatic or heteroaromatic ring system having 5 to 40 aromatic ring atoms, which may in each case be substituted by one or more radicals $R^1$, or for a combination of these systems. If the isonitrile ligand is a monodentate ligand, the substituent R particularly preferably stands on each occurrence, identically or differently, for a straight-chain alkyl group having 1 to 10 C atoms or a branched or cyclic alkyl group having 3 to 10 C atoms, each of which may be substituted by one or more radicals $R^1$, where one or more non-adjacent $CH_2$ groups may be replaced by $R^1C=CR^1$, $C\equiv C$, $C=O$, $C=S$ or O and where one or more H atoms may be replaced by D, F or CN, or for a monovalent aromatic or heteroaromatic ring system having 5 to 20 aromatic ring atoms, which may in each case be substituted by one or more radicals $R^1$, or for a combination of these systems. In a very particularly preferred embodiment of the invention, the substituent R is on each occurrence, identically or differently, a monovalent aromatic or heteroaromatic ring system having 5 to 20 aromatic ring atoms, which may in each case be substituted by one or more radicals $R^1$.

Examples of monodentate isonitrile ligands are aliphatic isonitriles, such as, for example, methylisonitrile, trifluoromethylisonitrile, isopropylisonitrile, tert-butylisonitrile, cyclohexylisonitrile or adamantylisonitrile, or aromatic isonitriles, such as, for example, phenylisonitrile, mesitylisonitrile, 2,6-dimethylphenylisonitrile, 2,6-diisopropylphenylisonitrile or 2,6-di-tert-butylphenylisonitrile. Preference is given to aromatic isonitriles. If R stands for an aromatic or heteroaromatic ring system, this is preferably substituted by substituents $R^1$ other than H, in particular by alkyl groups, ortho to the isonitrile group in at least one position, particularly preferably ortho to the isonitrile group in both positions.

The radicals R on the isonitrile groups may also be linked to one another and thus form a ring system together with the metal M. Thus, two radicals R may be linked to one another to form bidentate isonitrile ligands. Three radicals R may likewise be linked to one another to form tridentate isonitrile ligands. The formation of tetradentate, pentadentate and hexadentate ligands is likewise possible entirely analogously. The ligand L may likewise bond to the radical R on the isonitrile ligand and thus form a ring system together with the metal M, giving bidentate ligands which coordinate via an isonitrile group and a further group. The formation of tri-, tetra-, penta- and hexadentate ligands from the radicals $R^1$ on the ligand L and the radicals R on the isonitrile is possible entirely analogously.

In a preferred embodiment of the invention, the substituents R form a chain-shaped, branched or mono- or polycyclic, aliphatic, aromatic and/or benzo-fused structure with one another and/or together with the ligand L and thus have a polydentate or polypodal ligand character.

Preferred polydentate isonitrile ligands as can be used in complexes of the formula (1) have a structure of the formula (2) or formula (3):

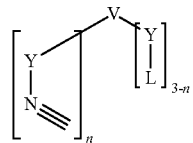

formula (2)

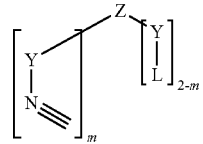

formula (3)

where R¹ and L have the meanings mentioned above, and the following applies to the other symbols and indices used:

Y is on each occurrence, identically or differently, a single bond, O, S, N(R¹), C=O, a straight-chain alkylene group having 1 to 6 C atoms or a branched or cyclic alkylene group having 3 to 6 C atoms, each of which may be substituted by one or more radicals R¹, where one or more non-adjacent CH₂ groups may be replaced by R¹C=CR¹, NR¹, Si(R¹)₂, O or S and where one or more H atoms may be replaced by D, F, Cl, Br, I, CN or NO₂, or an arylene or heteroarylene group having 5 to 20 aromatic ring atoms, which may be substituted by one or more radicals R¹, or a combination of these systems;

V is B, B(R¹)⁻, CR¹, CO⁻, CN(R¹)₂, SiR¹, N, NO, N(R¹)⁺, P, P(R¹)⁺, PO, PS, As, As(R¹)⁺, AsO, S⁺, Se⁺, or a unit of the formulae (4) to (7):

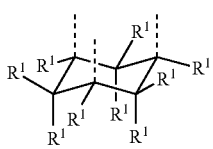

formula (4)

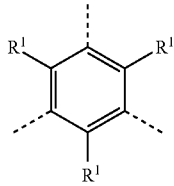

formula (5)

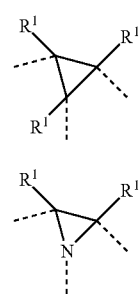

formula (6)

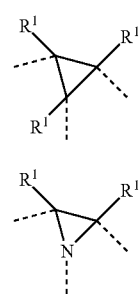

formula (7)

where the dashed bonds in each case indicate the bonding to Y;

Z is BR¹, B(R¹)₂⁻, C(R¹)₂, C(=O), Si(R¹)₂, NR¹, PR¹, P(R¹)₂⁺, PO(R¹), PS(R¹), AsR¹, AsO(R¹), AsS, O, S, Se, or a unit of the formulae (8) to (17):

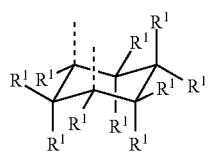

formula (8)

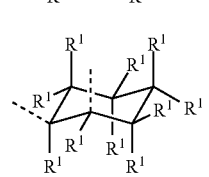

formula (9)

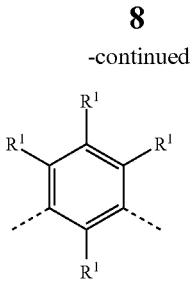

formula (10)

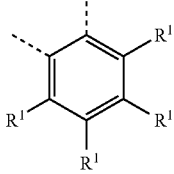

formula (11)

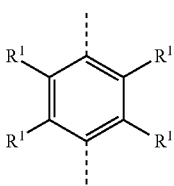

formula (12)

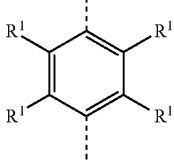

formula (13)

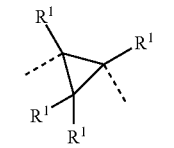

formula (14)

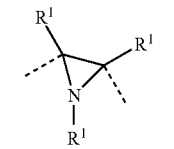

formula (15)

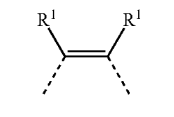

formula (16)

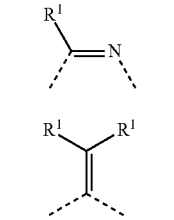

formula (17)

where the dashed bonds in each case indicate the bonding to Y;

n is 1, 2 or 3, preferably 2 or 3;

m is 1 or 2, preferably 2.

The bridge length in the ligands of the formulae (2) and (3) is preferably between 6 and 12 atoms. The bridge length is taken to mean the number of atoms in the two groups Y and in the group V or Z which represent the direct connection between the isonitrile groups or between the isonitrile group and the ligand group L. The bridge length is particularly preferably between 7 and 10 atoms, very particularly preferably between 7 and 9 atoms.

Examples of suitable ligands are the polypodal isonitrile ligands disclosed in F. E. Hahn et al., *J. Organomet. Chem.* 1994, 467, 103-111, F. E. Hahn et al., *J. Organomet. Chem.*

1991, 410, C9-C12, F. E. Hahn et al., *Angew. Chem.* 1992, 104, 1218-1221, F. E. Hahn et al., *Angew. Chem.* 1991, 103, 213-215, F. E. Hahn et al., *Organometallics* 1994, 13, 3002-3008 and F. E. Hahn et al., *Organometallics* 1992, 11, 84-90.

Examples of particularly preferred ligands of the formulae (2) and (3) are the ligands of the formulae (18) to (28) depicted below, each of which may be substituted by one or more radicals $R^1$:

formula (18)
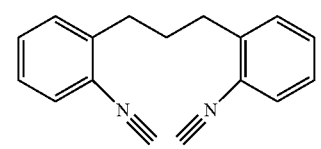

formula (19)
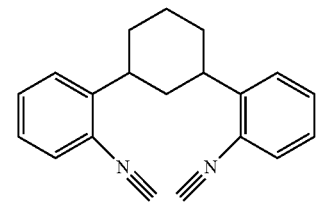

formula (20)
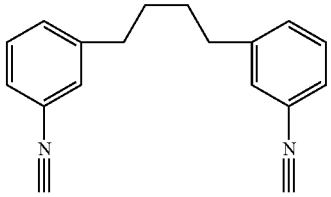

formula (21)
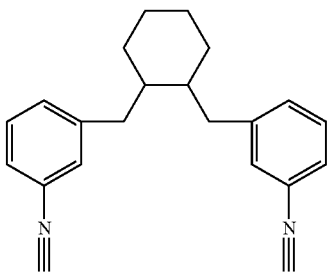

formula (22)
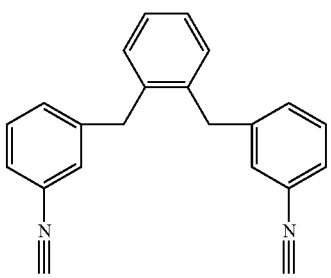

formula (23)
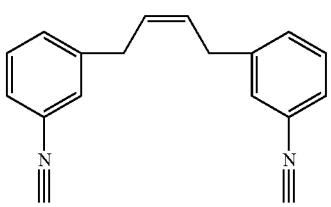

formula (24)
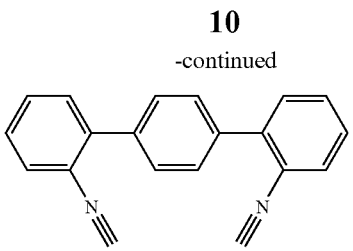

formula (25)
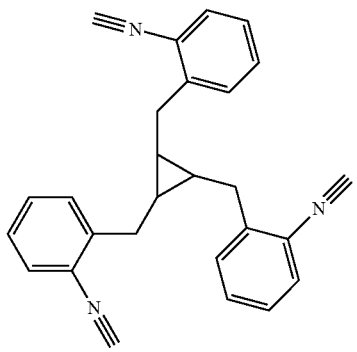

formula (26)
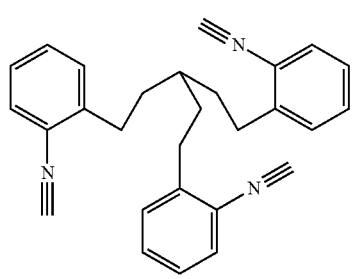

formula (27)
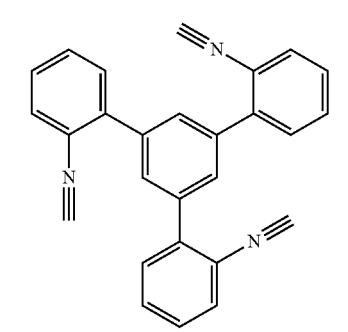

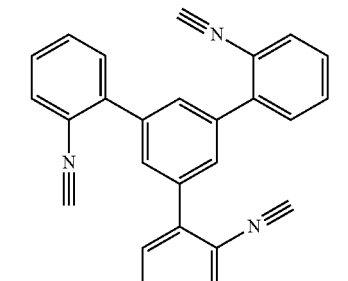

formula (28)
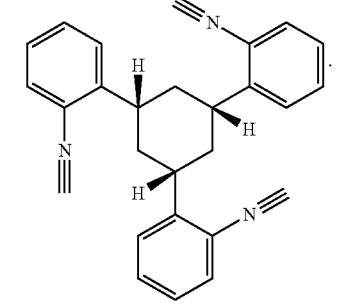

In a preferred embodiment of the invention, the metal M is pentacoordinated and the compound of the formula (1) contains a tridentate ligand of the formula (2) and a bidentate ligand of the formula (3).

In a further preferred embodiment of the invention, the metal M is hexacoordinated and the compound of the formula (1) contains either two tridentate ligands of the formula (2) or three bidentate ligands of the formula (3).

Preferred ligands L as occur in formula (1) are described below. The ligand groups L in the ligands of the formulae (2) and (3) can also be selected correspondingly, in which case they are bonded to the group Y.

The ligands L are preferably neutral, monoanionic, dianionic or trianionic ligands, particularly preferably neutral or monoanionic ligands. They may be monodentate, but are preferably bidentate or tridentate, i.e. preferably have two or three coordination sites. The ligands L may also be bonded to the radical R. Preferred embodiments here are the ligands of the formulae (2) and (3) mentioned above. In ligands of the formulae (2) and (3), L is preferably a monodentate or bidentate ligand.

Preferred neutral, monodentate ligands L are selected from carbon monoxide, nitrogen monoxide, amines, such as, for example, trimethylamine, triethylamine, morpholine, phosphines, in particular halophosphines, trialkylphosphines, triarylphosphines or alkylarylphosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluorostibine, trimethylstibine, tricyclohexylstibine, tri-tert-butylstibine, triphenylstibine, tris(pentafluorophenyl)stibine, nitrogen-containing heterocycles, such as, for example, pyridine, pyridazine, pyrazine, pyrimidine, triazine, and carbenes, in particular Arduengo carbenes.

Preferred monoanionic, monodentate ligands L are selected from hydride, deuteride, the halides F, Cl, Br and I, alkylacetylides, such as, for example, methyl-C≡C$^-$, tert-butyl-C≡C$^-$, arylacetylides, such as, for example, phenyl-C≡C$^-$, cyanide, azide, cyanate, isocyanate, thiocyanate, isothiocyanate, aliphatic or aromatic alcoholates, such as, for example, methanolate, ethanolate, propanolate, iso-propanolate, tert-butylate, phenolate, aliphatic or aromatic thioalcoholates, such as, for example, methanethiolate, ethanethiolate, propanethiolate, iso-propanethiolate, tert-thiobutylate, thiophenolate, amides, such as, for example, dimethylamide, diethylamide, di-iso-propylamide, morpholide, carboxylates, such as, for example, acetate, trifluoroacetate, propionate, benzoate, aryl groups, such as, for example, phenyl, naphthyl, and anionic, nitrogen-containing heterocycles, such as pyrrolide, imidazolide, pyrazolide. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred di- or trianionic ligands are $O^{2-}$, $S^{2-}$, carbides, which result in coordination in the form R—C≡M, and nitrenes, which result in coordination in the form R—N=M, where R generally stands for a substituent, or N.

Preferred neutral or mono- or dianionic bidentate or polydentate ligands L are selected from diamines, such as, for example, ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, such as, for example, 2-[1-(phenylimino)ethyl]pyridine, 24'-(2-methylphenylimino)ethyl]pyridine, 2-[1-(2,6-di-iso-propylphenylimino)ethyl]pyridine, 2-[1-(methylimino)ethyl]-pyridine, 2-[1-(ethylimino)ethyl]pyridine, 24'-(iso-propylimino)ethylipyridine, 2-[1-(tert-butylimino)ethyl]pyridine, diimines, such as, for example, 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-iso-propylphenylimino)butane, 2,3-bis(2,6-di-tert-butylphenylimino)butane, heterocycles containing two nitrogen atoms, such as, for example, 2,2'-bipyridine, o-phenanthroline, diphosphines, such as, for example, bis(diphenylphosphino)methane, bis(diphenylphosphino)ethane, bis(diphenylphosphino)propane, bis(diphenylphosphino)butane, bis(dimethylphosphino)methane, bis(dimethylphosphino)ethane, bis(dimethylphosphino)propane, bis(dimethylphosphino)butane, bis(diethylphosphino)methane, bis(diethylphosphino)ethane, bis(diethylphosphino)propane, bis(diethylphosphino)butane, bis(di-tert-butylphosphino)methane, bis(di-tert-butylphosphino)ethane, bis(tert-butylphosphino)propane, bis(di-tert-butylphosphino)butane, 1,3-diketonates derived from 1,3-diketones, such as, for example, acetylacetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol.

Preferred tridentate ligands are borates of nitrogen-containing heterocycles, such as, for example, tetrakis(1-imidazolyl) borate and tetrakis(1-pyrazolyl) borate.

Preference is furthermore given to bidentate monoanionic ligands L which, with the metal, form a cyclometallated five- or six-membered ring with at least one metal-carbon bond, in particular a cyclometallated five-membered ring. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals $R^1$. A multiplicity of such ligands is known to the person skilled in the art in the area of phosphorescent electroluminescent devices, and he will be able, without inventive step, to select further ligands of this type as ligand L for compounds of the formula (1). The combination of two groups as depicted by the following formulae (29) to (56) is generally particularly suitable for this purpose, where one group is bonded via a neutral nitrogen atom or a carbene atom and the other group is bonded via a negatively charged carbon atom or a negatively charged nitrogen atom. The ligand L can then be formed from the groups of the formulae (29) to (56) through these groups bonding to one another in each case at the position denoted by #. The position at which the groups coordinate to the metal is denoted by *. In ligands of the formula (2) or (3), individual groups of these may also be bonded as ligand L to the group Y of the ligand.

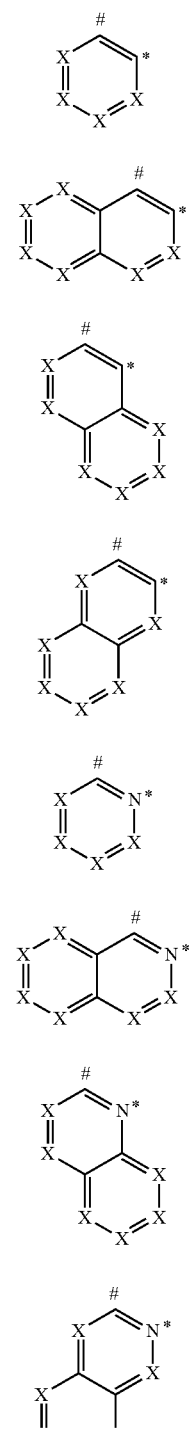
formula (29)
formula (30)
formula (31)
formula (32)
formula (33)
formula (34)
formula (35)
formula (36)
formula (37)
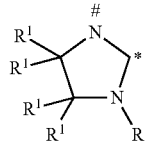 formula (38)
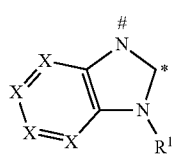 formula (39)
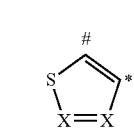 formula (40)
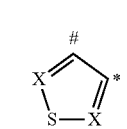 formula (41)
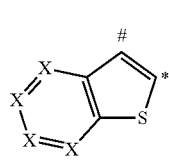 formula (42)
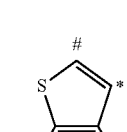 formula (43)
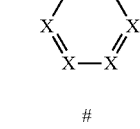 formula (44)
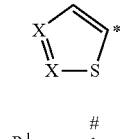 formula (45)
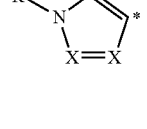 formula (46)
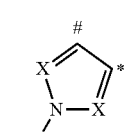 formula (47)
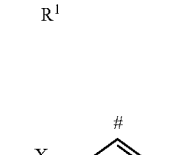

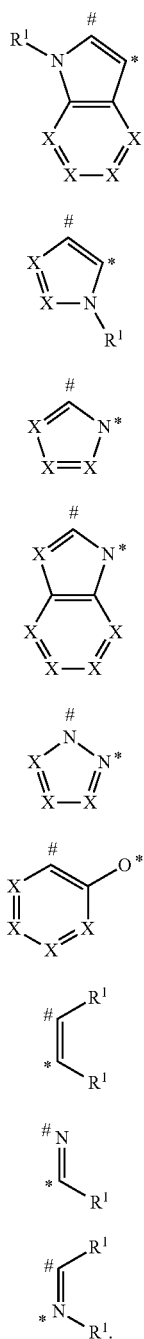

formula (48)

formula (49)

formula (50)

formula (51)

formula (52)

formula (53)

formula (54)

formula (55)

formula (56)

The symbols used have the same meaning as described above, and X stands, identically or differently on each occurrence, for $CR^1$ or N, with the proviso that a maximum of three symbols X in each group stand for N. Preferably a maximum of two symbols X in each group stand for N, particularly preferably a maximum of one symbol X in each group stands for N, very particularly preferably all symbols X stand for $CR^1$.

Likewise preferred ligands L are $\eta^5$-cyclopentadienyl, $\eta^5$-pentamethyl-cyclopentadienyl, $\eta^6$-benzene or $\eta^7$-cycloheptatrienyl, each of which may be substituted by one or more radicals $R^1$.

Likewise preferred ligands L are 1,3,5-cis-cyclohexane derivatives, in particular of the formula (57), 1,1,1-tri(methylene)methane derivatives, in particular of the formula (58), and 1,1,1-trisubstituted methanes, in particular of the formulae (59) and (60):

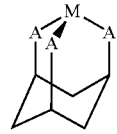

formula (57)

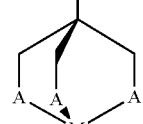

formula (58)

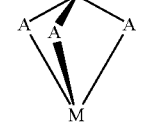

formula (59)

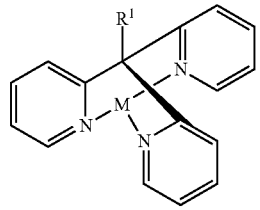

formula (60)

where the coordination to the metal M is shown in each of the formulae, $R^1$ has the meaning mentioned above, and A stands, identically or differently on each occurrence, for $O^-$, $S^-$, $COO^-$, $P(R^1)_2$ or $N(R^1)_2$.

The isonitrile complexes can be prepared, for example, by a substitution reaction, in which metal complexes are reacted with the isonitrile ligands, optionally in the presence of a catalyst, to give the desired isonitrile complexes. In this way, tri-, tetra-, penta- and hexaisonitrile molybdenum or tungsten compounds are accessible, for example, starting from molybdenum or tungsten hexacarbonyl or olefinmolybdenum or -tungsten carbonyl complexes. This type of reaction is suitable both for the reaction of monodentate and also of polydentate isonitrile ligands. Palladium(II) oxide can be added as catalyst (Albers et al., *J. Chem. Edu.* 1986, 63(5), 444; Coville et al., *Inorg. Chim. Acta* 1982, 65, L7-L8; Yamamoto et al., *J. Organomet. Chem.* 1985, 282, 191; Hahn et al., *Organometallics* 1994, 13, 3002; F. Hahn et al., *Organometallics* 1992, 11, 84).

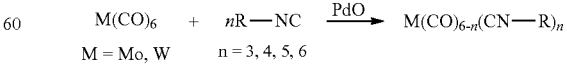

In addition, metal salts can be reacted with isonitrile ligands to give isonitrilemetal halides, and the halide ligands therein can subsequently be exchanged for other mono- or polydentate ligands.

Both the isonitrile ligand and the ligand L here may be mono- or polydentate.
Examples of preferred compounds of the formula (1) are structures (1) to (98) depicted below.
(1)
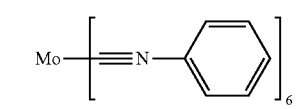
(2)
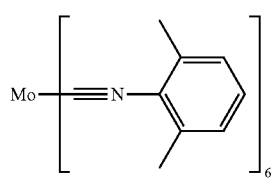
(3)
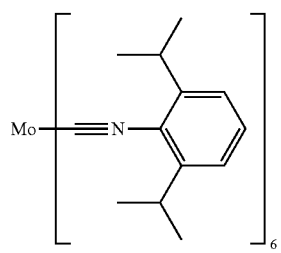
(4)
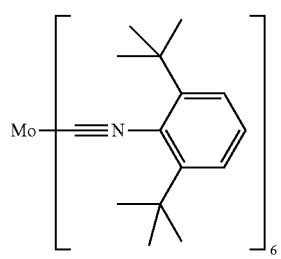
(5)
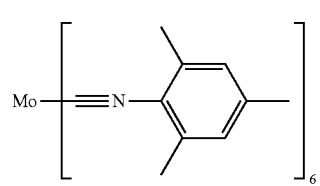
(6)
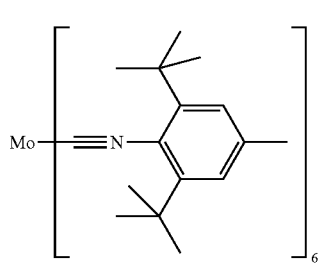
(7)
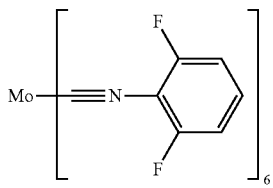
(8)
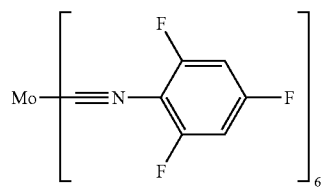
(9)
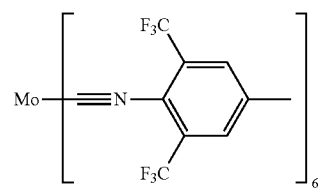
(10)
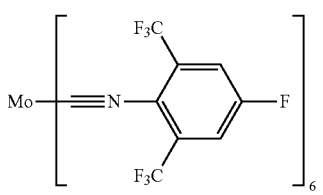
(11)
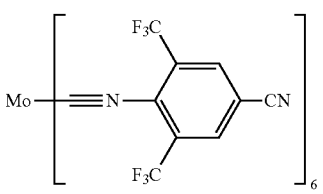
(12)
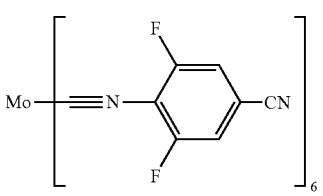
(13)
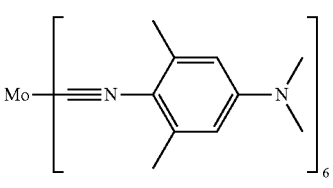
(14)
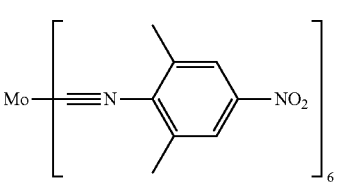

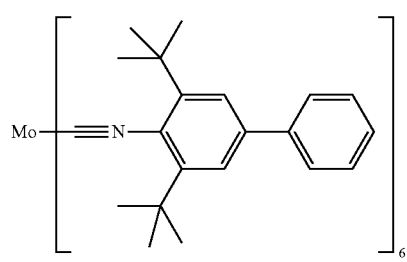 (15)
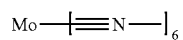 (16)
 (17)
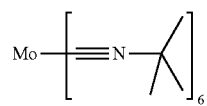 (18)
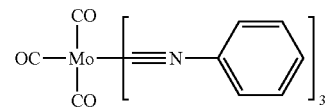 (19)
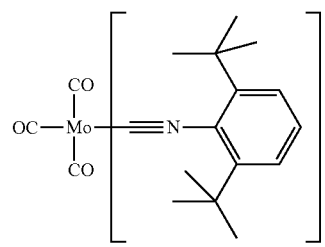 (20)
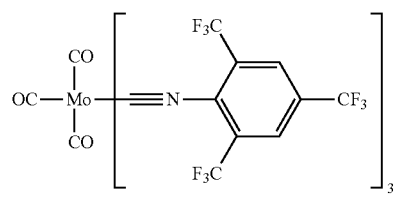 (21)
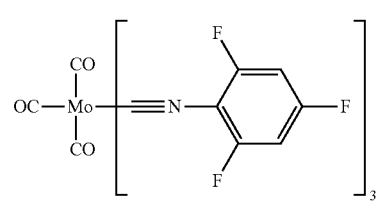 (22)
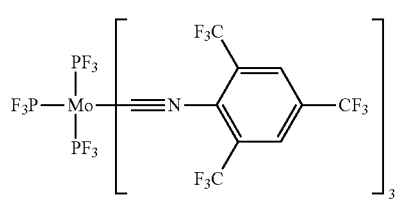 (23)
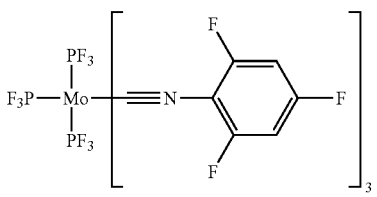 (24)
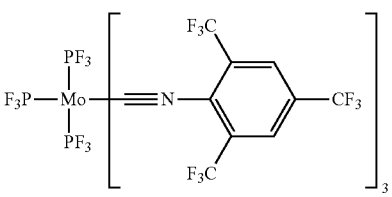 (25)
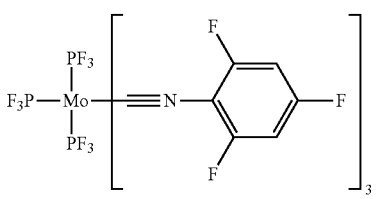 (26)
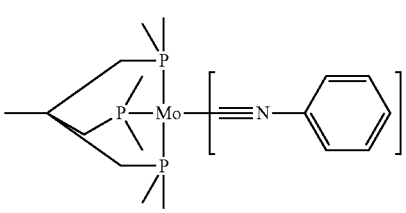 (27)
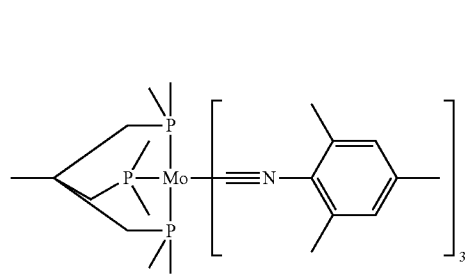 (28)
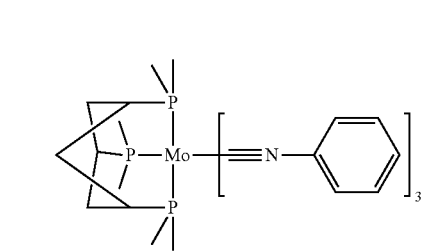 (29)
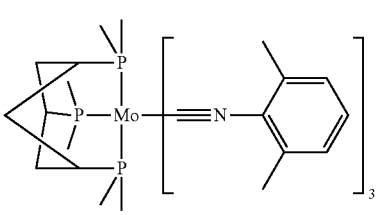 (30)

(31)
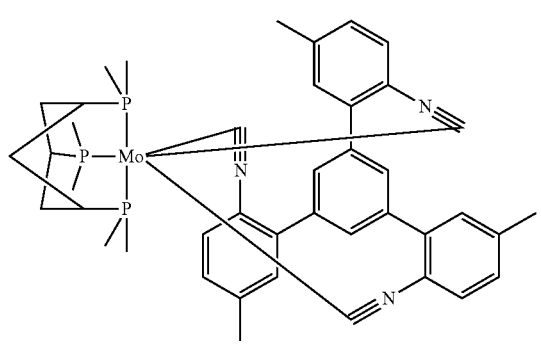
(32)
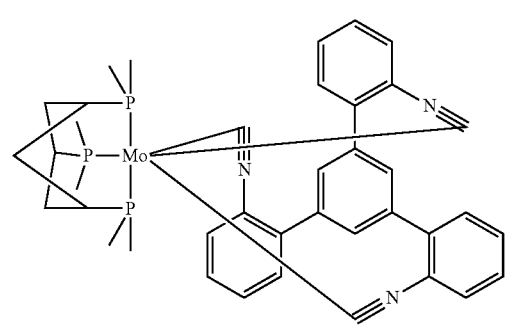
(33)
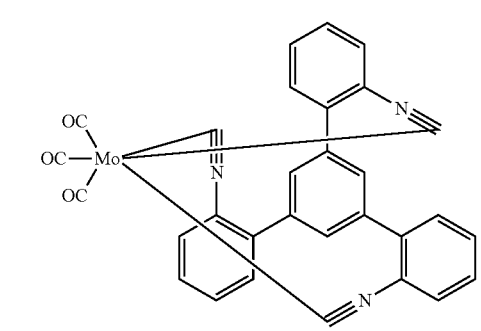
(34)
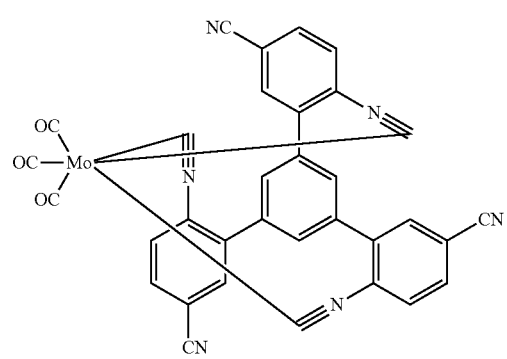
(35)
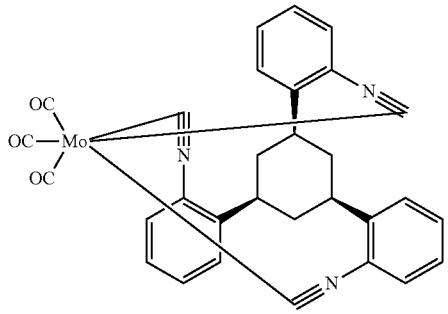
(36)
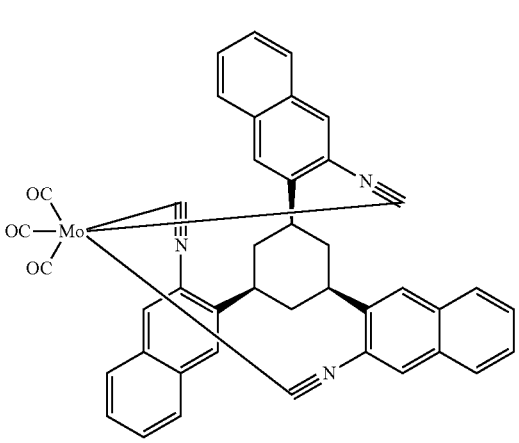
(37)
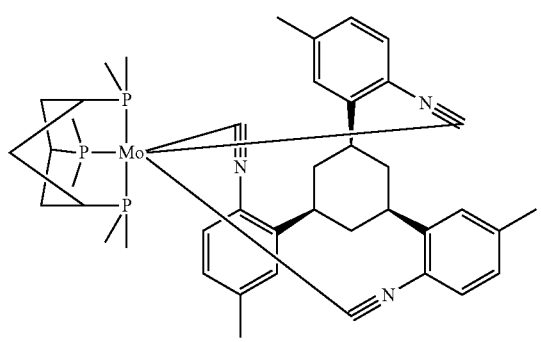
(38)
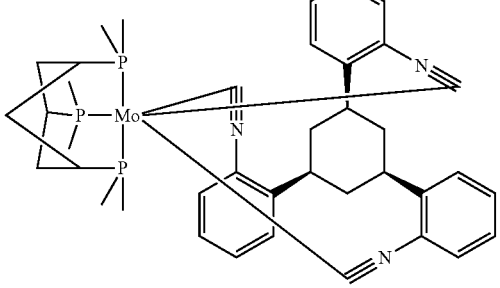
(39)
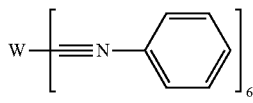

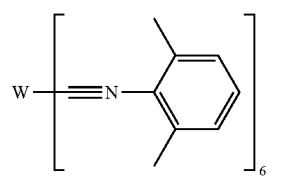
(40)
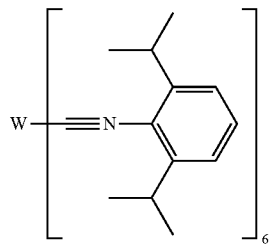
(41)
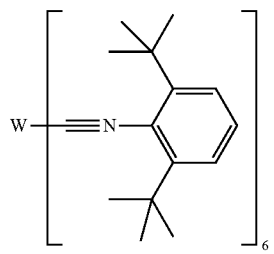
(42)
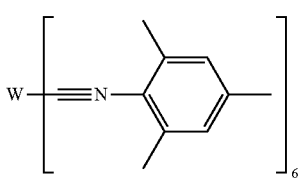
(43)
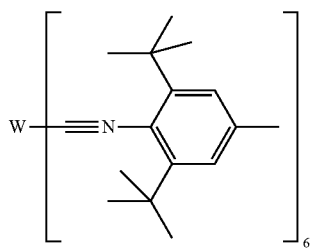
(44)
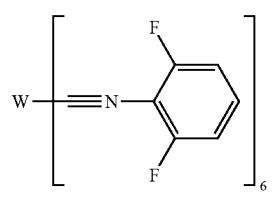
(45)
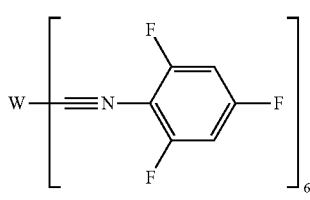
(46)
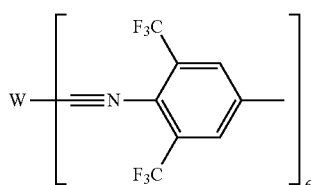
(47)
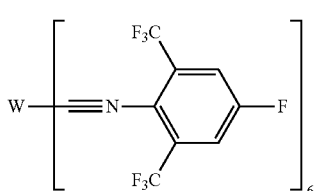
(48)
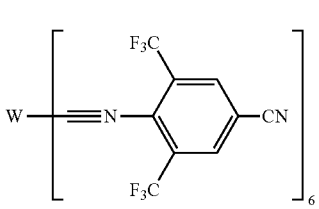
(49)
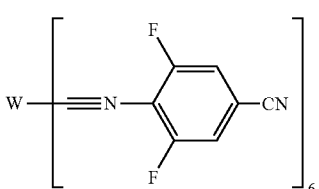
(50)
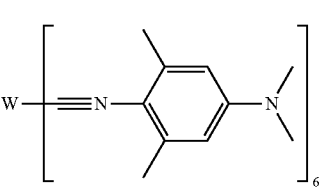
(51)
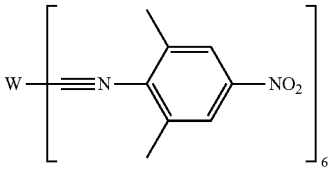
(52)
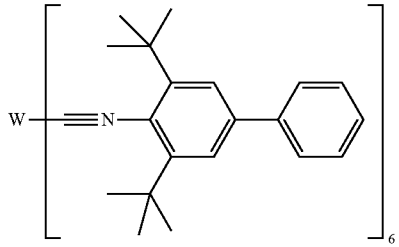
(53)
(54)
(55)

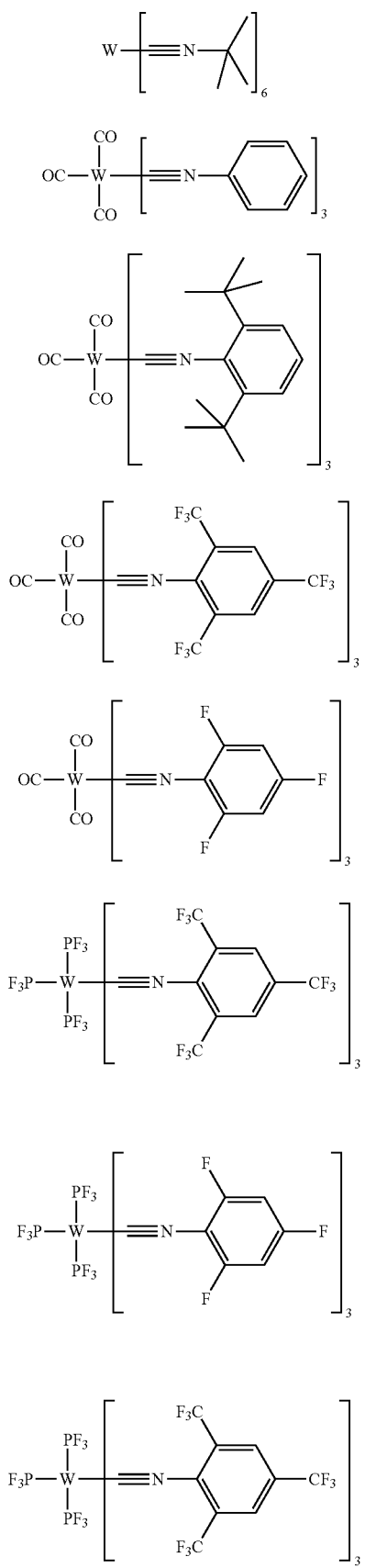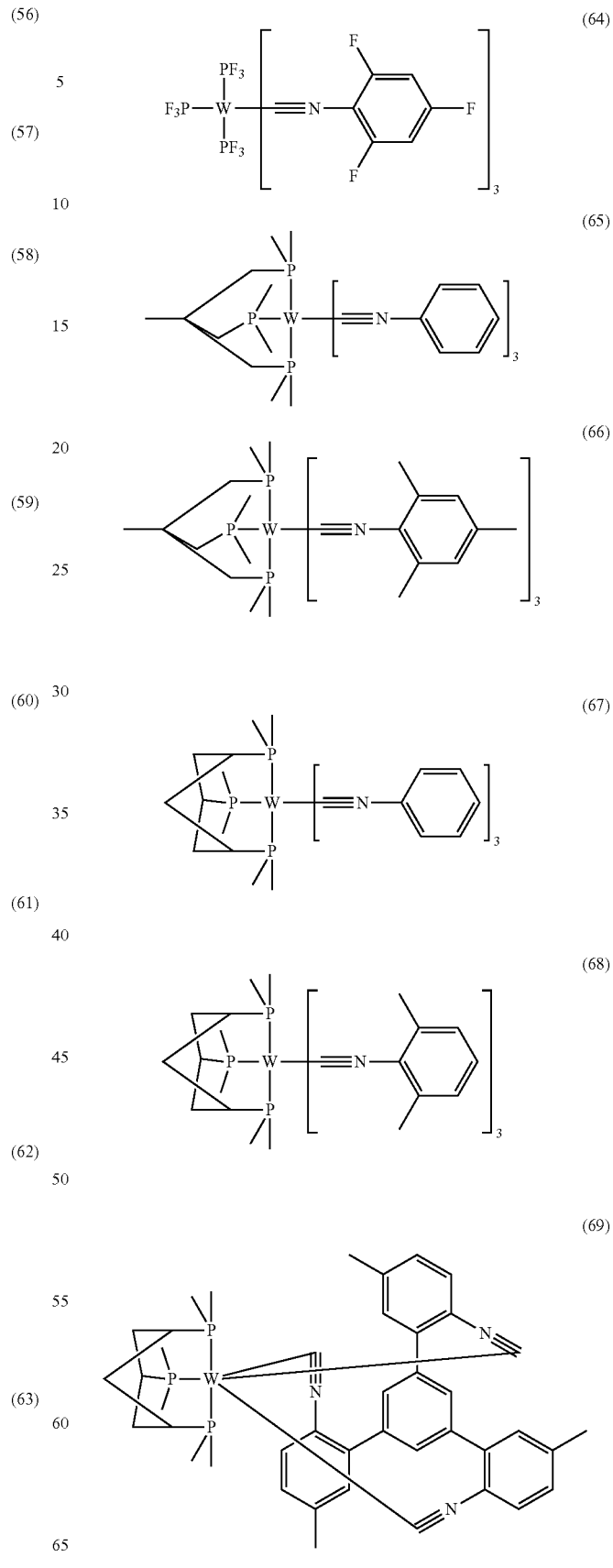

(70) 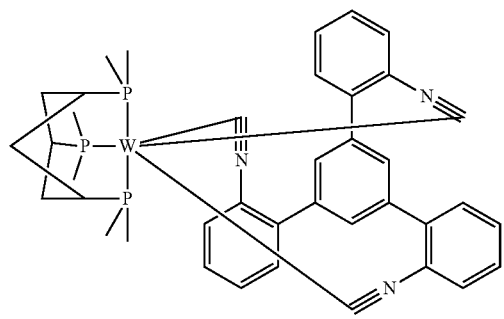
(71) 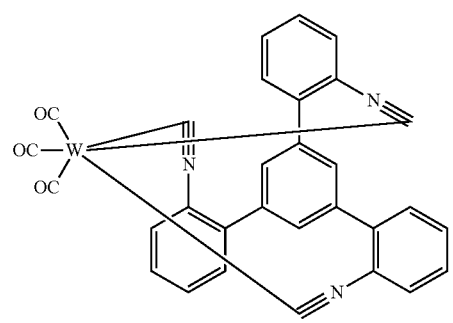
(72) 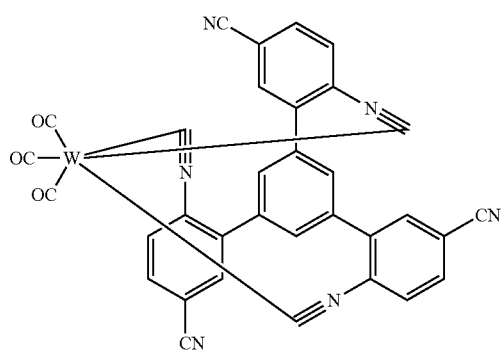
(73) 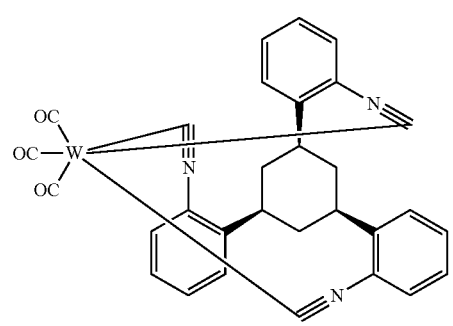
(74) 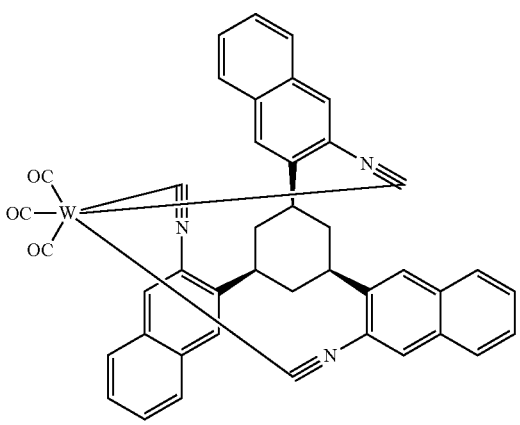
(75) 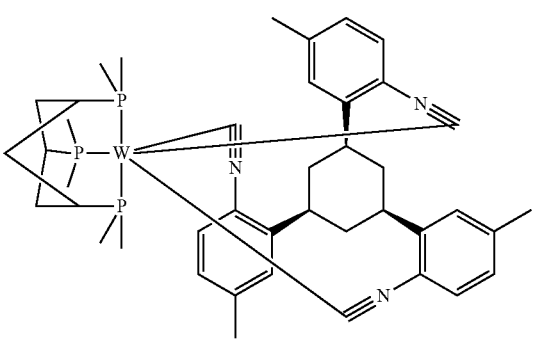
(76) 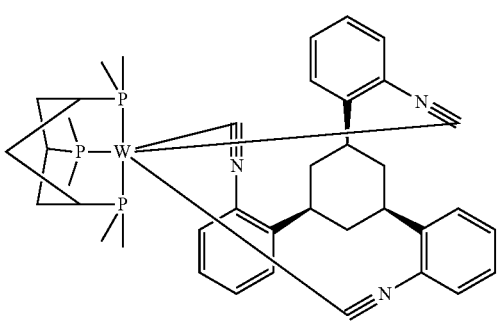
(77) 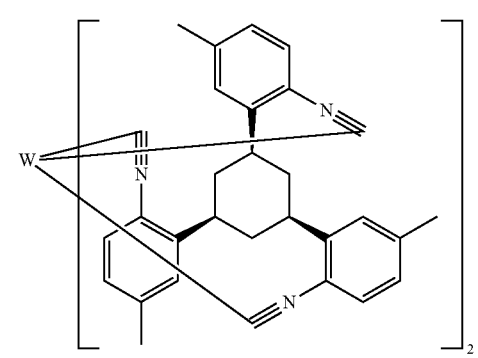

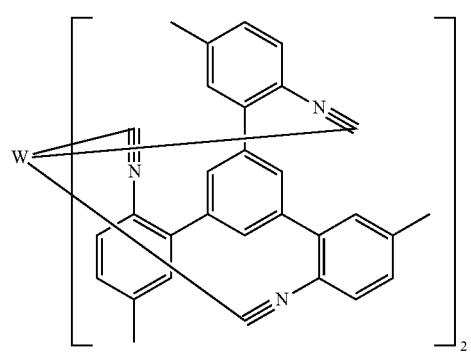
(78)
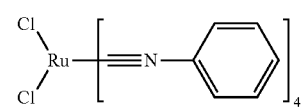
(79)
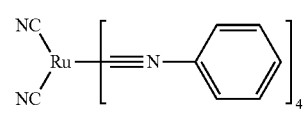
(80)
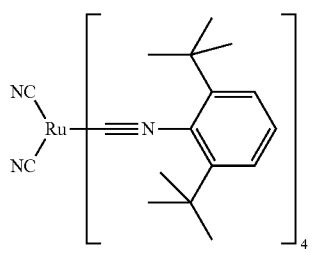
(81)
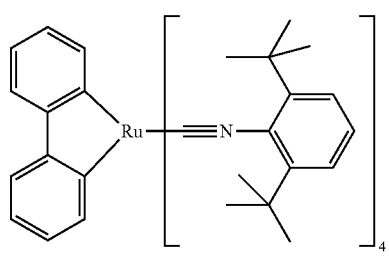
(82)
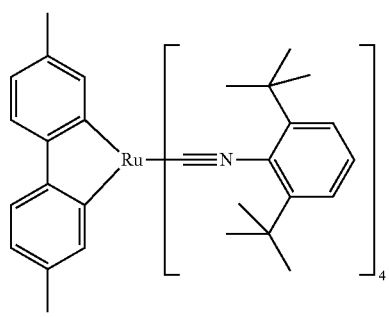
(83)
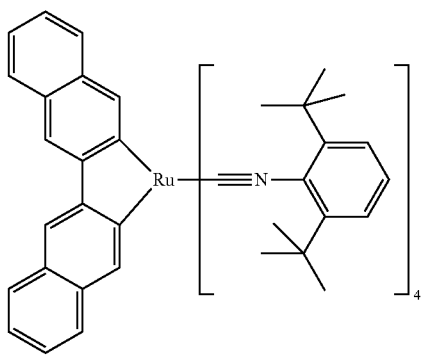
(84)
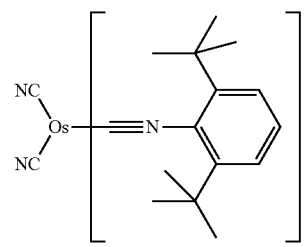
(85)
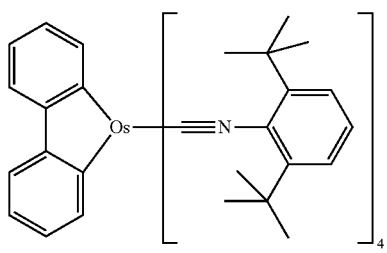
(86)
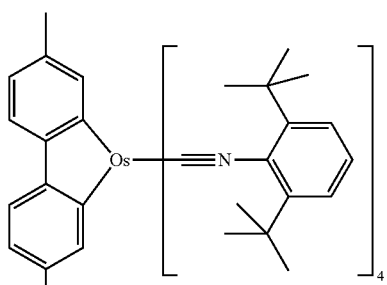
(87)
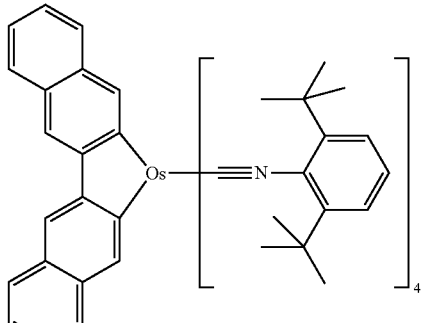
(88)

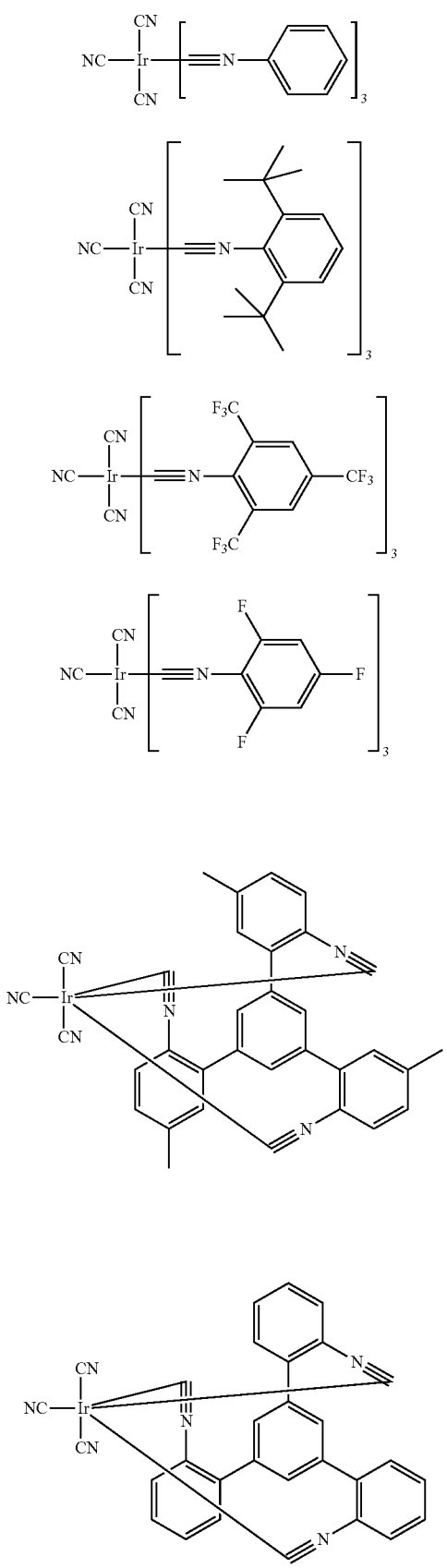

The complexes of the formula (1) described above and the preferred embodiments mentioned above are used as active component in the electronic device. Active components are generally the organic or inorganic materials which have been introduced between anode and cathode, for example charge-injection, charge-transport or charge-blocking materials, but in particular emission materials and matrix materials. The compounds according to the invention exhibit particularly good properties for these functions, in particular as emission material in organic electroluminescent devices. Organic electroluminescent devices are therefore a preferred embodiment of the invention.

The organic electroluminescent device comprises cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers, charge-generation layers and/or organic or inorganic p/n junctions. Interlayers, which have, for example, an exciton-blocking function and/or control the charge balance in the electroluminescent device, may likewise be introduced between two emitting layers. However, it should be pointed out that each of these layers does not necessarily have to be present. The organic electroluminescent device may comprise one emitting layer or it may comprise a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure, see, for example, WO 05/011013), or systems which have more than three emitting layers.

In a preferred embodiment of the invention, the organic electronic device comprises the compound of the formula (1) or the preferred embodiments mentioned above as emitting compound in one or more emitting layers.

If the compound of the formula (1) is employed as emitting compound in an emitting layer, it is preferably employed in combination with one or more matrix materials. The mixture of the compound of the formula (1) and the matrix material comprises between 1 and 99% by vol., preferably between 2 and 90% by vol., particularly preferably between 3 and 40% by vol., in particular between 5 and 15% by vol., of the compound of the formula (1), based on the entire mixture comprising emitter and matrix material. Correspondingly, the mixture comprises between 99 and 1% by vol., preferably between 98 and 10% by vol., particularly preferably between 97 and 60% by vol., in particular between 95 and 85% by vol., of the matrix material, based on the entire mixture comprising emitter and matrix material.

Preferred matrix materials are CBP (N,N-biscarbazolylbiphenyl), carbazole derivatives (for example in accordance with WO 05/039246, US 2005/0069729, JP 2004/288381, EP 1205527 or WO 08/086,851), aza-carbazoles (for example in accordance with EP 1617710, EP 1617711, EP 1731584, JP 2005/347160), ketones (for example in accordance with WO 04/093207 or the unpublished application DE 102008033943.1), phosphine oxides, sulfoxides and sulfones (for example in accordance with WO 05/003253), oligophenylenes, aromatic amines (for example in accordance with US 2005/0069729), bipolar matrix materials (for example in accordance with WO 07/137,725), silanes (for example in accordance with WO 05/111172), 9,9-diarylfluorene derivatives (for example in accordance with the unpublished application DE 102008017591.9), azaboroles, boronic esters (for example in accordance with WO 06/117052), indolocarbazoles (WO 07/063,754, WO 08/056,746), triazine derivatives (WO 07/063,754 or the unpublished application DE 102008036982.9), zinc complexes (EP 652273 or the unpublished application DE 102007053771.0).

Preference is furthermore given to an organic electroluminescent device, characterised in that one or more layers are applied by means of a sublimation process, in which the materials are applied by vapour deposition in vacuum sublimation units at an initial pressure of less than $10^{-5}$ mbar, preferably less than $10^{-6}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and structured in this way (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, for example, by suitable substitution, are necessary for this purpose.

The organic electroluminescent device can also be produced as a hybrid system by applying one or more layers from solution and vapour-depositing one or more other layers. Since the compounds of the formula (1) generally have high solubility in organic solvents, these compounds can be processed well from solution. Thus, it is possible, for example, to apply an emitting layer comprising a compound of the formula (1) and a matrix material from solution and to apply a hole-blocking layer and/or an electron-transport layer on top by vacuum vapour deposition.

These processes are generally known to the person skilled in the art and can be applied by him without problems to organic electroluminescent devices comprising compounds of the formula (1) or the preferred embodiments mentioned above.

Metal complexes which contain the ligands of the formula (27) and/or (28) mentioned above are novel and are therefore likewise a subject-matter of the present invention.

The invention therefore furthermore relates to metal complexes of the formula (1')

formula (1')

where the symbols and indices used have the meanings mentioned above, and at least one of the isonitrile ligands is selected from ligands of the formulae (27) and (28), each of which may also be substituted by one or more radicals $R^1$:

formula (27)

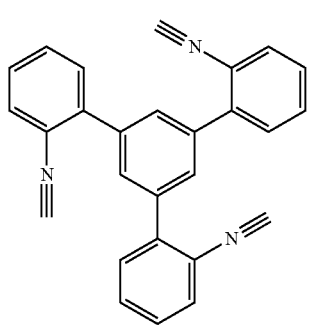

formula (28)

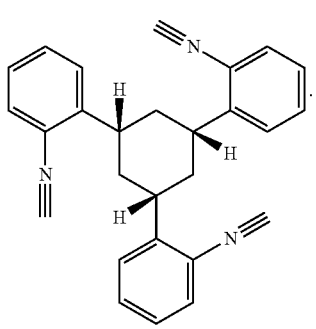

The same preferences as described above apply in complexes of the formula (1') to the choice of the metals and any further ligands present.

Solutions of the compounds of the formula (1') are necessary for application from solution. The invention therefore furthermore relates to solutions comprising at least one compound of the formula (1') and at least one organic solvent, preferably selected from the class of the aromatic organic solvents, for example dimethylanisole.

The invention furthermore relates to ligands of the formulae (27) and (28) depicted above, each of which may be substituted by one or more radicals $R^1$.

The electronic devices according to the invention, in particular organic electroluminescent devices, are distinguished by the following surprising advantages over the prior art:
1. Organic electroluminescent devices comprising compounds of the formula (1) as emitting materials have an excellent lifetime.
2. Organic electroluminescent devices comprising compounds of the formula (1) as emitting materials have excellent efficiency.
3. The luminescence lifetime of many compounds of the formula (1) at room temperature is in the region of less than 100 ns and is thus more than an order of magnitude less than the luminescence lifetime of iridium complexes or platinum complexes, as employed in accordance with the prior art in organic electroluminescent devices. The compounds of the formula (1) are therefore also particularly suitable for use in organic electroluminescent devices with passive-matrix addressing.

These advantages mentioned above are not accompanied by an impairment of the further electronic properties.

The invention is explained in greater detail by the following examples, without wishing to restrict it thereby. The person skilled in the art will be able to produce further electronic devices according to the invention from the descriptions without inventive step.

EXAMPLES

Examples 1 to 9

Synthesis of the Metal Complexes

The following syntheses are carried out under a protective-gas atmosphere in dried solvents, unless indicated otherwise. The solvents and reagents can be purchased from ALDRICH or ABCR.

Hexakis(phenyl)sonitrile)molybdenum(0) (Example 1), hexakis(phenylisonitrile)tungsten(0) (Example 2) and hexakis(2,4,6-tri-tert-butylphenylisonitrile)tungsten(0) (Example 3) can be prepared by the method of Albers et al., *J. Chem. Edu.* 1986, 63(5), 444, Coville et al., *Inorg. Chim. Acta* 1982, 65, L7-L8, or Yamamoto et al., *J. Organomet. Chem.* 1985, 282, 191. The compounds are repeatedly recrystallised from toluene/ethanol (1:2-1:1). The purities achieved in this way are typically >99.8% according to $^1$H-NMR.

Example 4

Trisphenylisonitrile[cis,cis-1,3,5-cyclohexanetriyltris[diphenylphosphine]-P,P',P'']molybdenum(0)

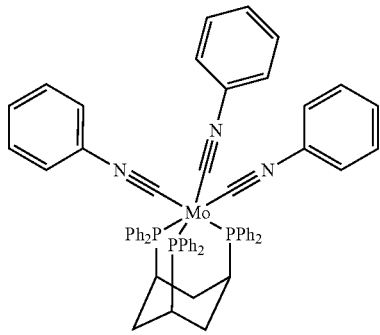

3.6 g (35 mmol) of phenylisonitrile and 50 mg of palladium (II) oxide are added to a suspension of 8.2 g [10 mmol] of tricarbonyl[cis,cis-1,3,5-cyclohexanetriyltris[diphenylphosphine]-P,P',P'']molybdenum(0) [156999-20-1] in 100 ml of toluene, and the mixture is subsequently stirred under reflux for 60 h. After cooling, the palladium(II) oxide is filtered off through silica gel, the red solution is concentrated to about 10 ml in vacuo, and 50 ml of ethanol are then added. After the mixture has been stirred for 12 h, the solid is filtered off with suction and recrystallised twice from toluene/ethanol. Yield: 4.3 g (4.1 mmol), 41.3%, purity according to $^1$H-NMR about 99.7%.

The complexes shown in the table were prepared analogously to Example 4 from the corresponding precursors.

| Ex. | Precursor | Product | Yield |
|---|---|---|---|
| 5 | 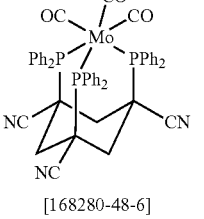 [168280-48-6] | 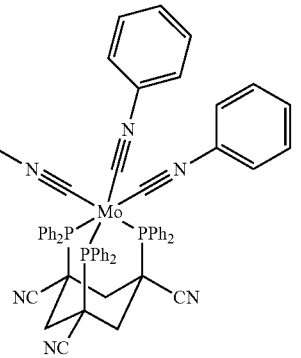 | 38.4% |
| 6 | 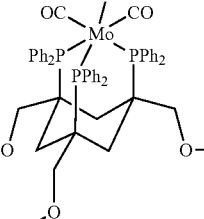 [182130-53-6] | 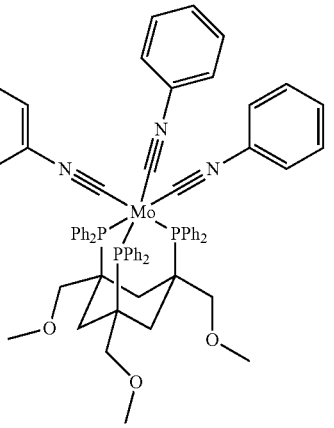 | 41.3% |
| 7 | 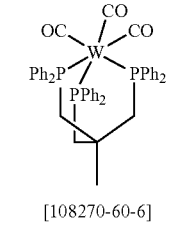 [108270-60-6] | 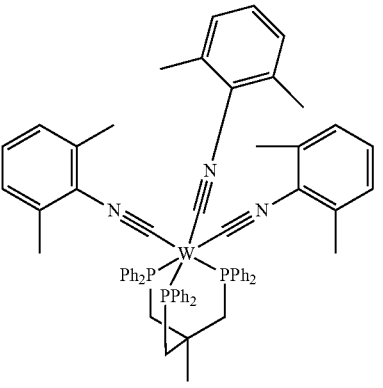 | 34.5% |

Example 8

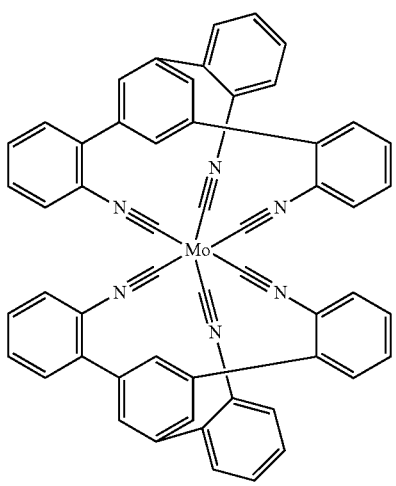

1,3,5-Tris(1-isocyanophen-2-yl)benzene is prepared from 1,3,5-tris(1-aminophen-2-yl)benzene [923027-14-9] by the method of F. E. Hahn et al., J. Organomet. Chem. 467, 130, 1994.

8.0 g (21 mmol) of 1,3,5-tris(1-isocyanophen-2-yl)benzene and 50 mg of palladium(II) oxide are added to a solution of 2.6 g (10 mmol) of molybdenum hexacarbonyl in 100 ml of toluene, and the mixture is subsequently stirred under reflux for 60 h. After cooling, the palladium(II) oxide is filtered off through silica gel, the red solution is concentrated to about 10 ml in vacuo, and 50 ml of ethanol are then added. After the mixture has been stirred for 12 h, the solid is filtered off with suction and then chromatographed on aluminium oxide, neutral, activity grade 4, with dichloromethane-diethyl ether 1:5. Yield: 6.1 g (7.1 mmol), 71.0%, purity according to $^1$H-NMR about 99.9%.

Example 9

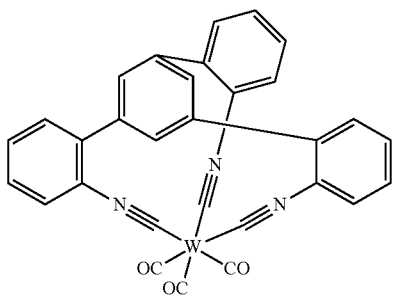

4.2 g (11 mmol) of 1,3,5-tris(1-isocyanophen-2-yl)benzene are added to a solution of 3.6 g (10 mmol) of cycloheptatrienyltungsten tricarbonyl in 100 ml of toluene, and the mixture is subsequently stirred under reflux for 5 h. After cooling, the mixture is concentrated to about 10 ml in vacuo, and 50 ml of heptane are then added, the precipitated solid is filtered off with suction, washed three times with 50 ml of heptane and recrystallised twice from chlorobenzene. Yield: 4.8 g (7.4 mmol), 73.9%, purity according to $^1$H-NMR about 99.9%.

Example 10

Luminescence Lifetime of the Complexes

The isonitrile complexes have the following luminescence lifetimes at room temperature (by the method of: K. Mann et al., J. Am. Chem. Soc. 1977, 99(1), 306):
hexakis(phenylisonitrile)molybdenum(0) (Example 1)=43 ns; hexakis(phenylisonitrile)tungsten(0) (Example 2)=83 ns.

It is clearly evident from this that the metal complexes of the formula (1) with isonitrile ligands have a significantly shorter luminescence lifetime than iridium or platinum complexes as usually used in OLEDs in accordance with the prior art. These complexes are thus also particularly suitable for use in electroluminescent devices with passive-matrix addressing.

Example 11

Production and Characterisation of Organic Electroluminescent Devices

LEDs are produced by the general process outlined below. This must of course be adapted in individual cases to the particular circumstances (for example layer-thickness variation in order to achieve optimum efficiency or colour).

General Process for the Production of OLEDs:

Components of this type are produced in accordance with the production of polymeric light-emitting diodes (PLEDs) which has already been described a number of times in the literature (for example in WO 2004/037887 A2). In the present case, the compounds according to the invention are dissolved in toluene or chlorobenzene together with the matrix materials or matrix-material combinations mentioned. The typical solids content of such solutions is between 10 and 25 g/l if, as here, the layer thickness of 80 nm which is typical for a device is to be achieved by means of spin coating.

The following compounds are used as matrix materials:

compound 1

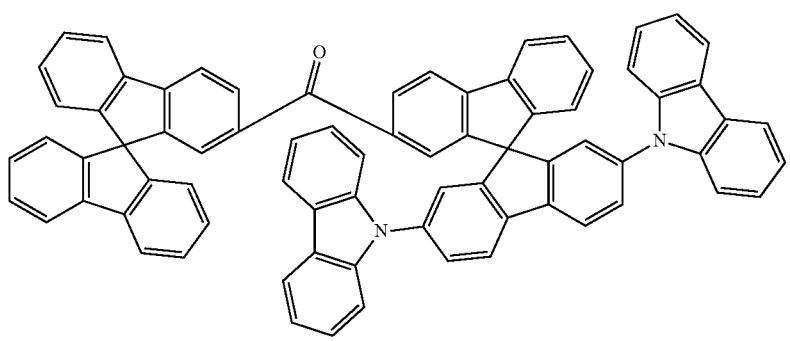

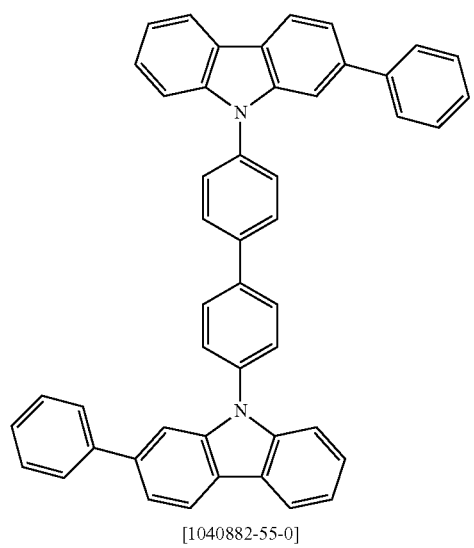

compound 2

[1040882-55-0]

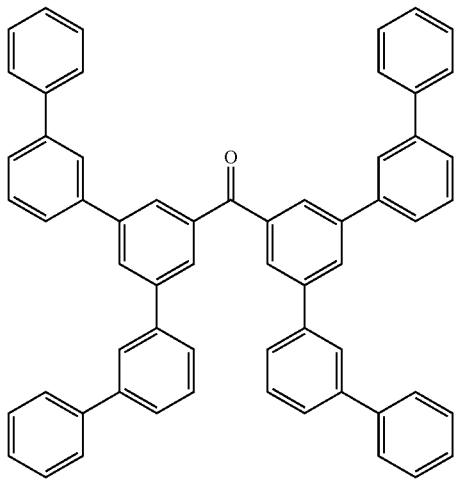

compound 3

DE102008033943.1

OLEDs having the following structure are produced analogously to the above-mentioned general process:

| PEDOT | 20 nm (spin-coated from water; PEDOT purchased from BAYER AG; poly[3,4-ethylenedioxy-2,5-thiophene]) |
| Matrix + emitter | 80 nm, 5% by weight emitter concentration (spin-coated from toluene or chlorobenzene) |
| Ba/Ag | 10 nm of Ba/150 nm of Ag as cathode. |

Structured ITO substrates and the material for the so-called buffer layer (PEDOT, actually PEDOT:PSS) are commercially available (ITO from Technoprint and others, PEDOT:PSS as Clevios Baytron P aqueous dispersion from H.C. Starck). The emission layer is applied by spin coating in an inert-gas atmosphere, in the present case argon, and dried by heating at 120° C. for 10 min. Finally, a cathode comprising barium and aluminium is applied by vacuum vapour deposition. The solution-processed devices are characterised by standard methods, the said OLED examples were not optimised.

The efficiency and the voltage at 500 cd/m² as well as the colour are shown in the table.

| Ex. | Matrix Emitter | Efficiency [cd/A] | Voltage [V] | Colour CIE x/y |
|---|---|---|---|---|
| 12 | PVK* Example 1 | 1.4 | 6.1 | 0.70/0.28 |
| 13 | Compound 1 Example 1 | 2.6 | 5.7 | 0.69/0.31 |
| 14 | Compound 2 Example 6 | 4.0 | 5.4 | 0.68/0.32 |
| 15 | Compound 2 Example 8 | 3.7 | 5.5 | 0.69/0.31 |
| 16 | Comp. 2 (30% by wt.) Comp. 3 (65% by wt.) Example 4 | 4.9 | 5.1 | 0.66/0.33 |

*PVK: Mw = 1,100,000 g/mol, purchased from Aldrich

The invention claimed is:
1. An electronic device comprising at least one metal complex of formula (1)

$$(L)_yM + C\equiv N-R]_x \quad \text{formula (1)}$$

wherein

M is a penta- or hexacoordinated transition metal selected from the group consisting of chromium, molybdenum, tungsten, ruthenium, osmium, rhodium, iridium, nickel, platinum, copper, silver, and gold;

L is on each occurrence, identically or differently, a mono-, bi- or tridentate ligand which bonds to the metal M and is optionally substituted by one or more radicals $R^1$, and wherein L is also optionally bonded to the radical R of the isonitrile group;

R is on each occurrence, identically or differently, an organic substituent having 1 to 60 C atoms and optionally substituted by one or more substituents $R^1$; wherein a plurality of radicals R are also optionally linked to one another and thus form a polydentate ligand, and wherein the radical R may also be linked to the ligand L;

$R^1$ is on each occurrence, identically or differently, H, D, F, Cl, Br, I, $N(R^2)_2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals $R^2$, wherein one or more non-adjacent $CH_2$ groups are optionally replaced by $R^2C=CR^2$, C≡C, $Si(R^2)_2$, $Ge(R^2)_2$, $Sn(R^2)_2$, C=O, C=S, C=Se, C=NR², P(=O)$(R^2)$, SO, $SO_2$, $NR^2$, O, S or $CONR^2$, and wherein one or more H atoms are optionally replaced by D, F, Cl, Br, I, CN or $NO_2$, an aromatic or heteroaromatic ring system having 5 to 60 aromatic ring atoms optionally substituted by one or more radicals $R^2$, an aryloxy or heteroaryloxy group having 5 to 60 aromatic ring atoms optionally substituted by one or more radicals R², a diarylamino group, diheteroarylamino group or aryl-heteroarylamino group having 10 to 40 aromatic ring atoms optionally substituted by one or more radicals R², or a combination of these systems; and wherein two or more substituents R¹ optionally define a mono- or polycyclic aliphatic, aromatic and/or benzo-fused ring system with one another;

R² is on each occurrence, identically or differently, H, D, F or an aliphatic, aromatic and/or heteroaromatic hydrocarbon radical having 1 to 20 C atoms wherein one or more H atoms are optionally replaced by D or F; and wherein two or more substituents R² optionally define a mono- or polycyclic, aliphatic or aromatic ring system with one another;

x is 3, 4, 5 or 6;

Y is 0, 1, 2 or 3, with the proviso that a coordination number on the metal of 5 or 6 is achieved, wherein one or more of the isonitrile ligands are monodentate ligands, wherein the substituent R is, identically or differently on each occurrence, a straight-chain alkyl group having 1 to 40 C atoms or a branched or cyclic alkyl group having 3 to 40 C atoms, each of which are optionally substituted by one or more radicals R¹, wherein one or more non-adjacent CH₂ groups are optionally replaced by O, and wherein one or more H atoms are optionally replaced by F, a monovalent aromatic or heteroaromatic ring system having 5 to 60 aromatic ring atoms, each of which are optionally substituted by one or more radicals R¹; or wherein the metal complex contains one or more isonitrile ligands having a structure of the formula (2) or formula (3):

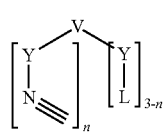

formula (2)

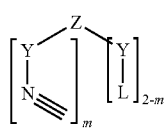

formula (3)

wherein

Y is on each occurrence, identically or differently, a single bond, O, S, N(R¹), C=O, a straight-chain alkylene group having 1 to 6 C atoms or a branched or cyclic alkylene group having 3 to 6 C atoms, each of which are optionally substituted by one or more radicals R¹, wherein one or more non-adjacent CH₂ groups are optionally replaced by R¹C=CR¹, NR¹, Si(R¹)₂, O or S, and wherein one or more H atoms are optionally replaced by D, F, Cl, Br, I, CN, or NO₂, an arylene or heteroarylene group having 5 to 20 aromatic ring atoms optionally substituted by one or more radicals R¹, or a combination of these systems;

V is B, B(R¹)⁻, CR¹, CO⁻, CN(R¹)₂, SiR¹, N, NO, N(R¹)⁺, P, P(R¹)⁺, PO, PS, As, As(R¹)⁺, AsO, S⁺, Se⁺, or a unit of the formula (4), (5), (6), or (7):

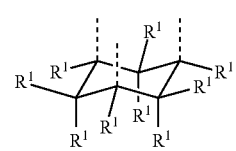

formula (4)

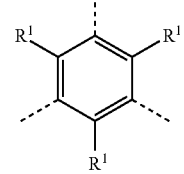

formula (5)

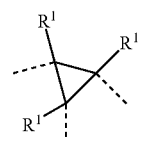

formula (6)

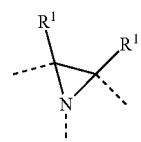

formula (7)

where the dashed bonds in each case indicate the bonding to Y;

Z is BR¹, B(R¹)₂⁻, C(R¹)₂, C(=O), Si(R¹)₂, NR¹, PR¹, P(R¹)₂⁺, PO(R¹), PS(R¹), AsR¹, AsO(R¹), AsS, O, S, Se, or a unit of the formulae (8) to (17):

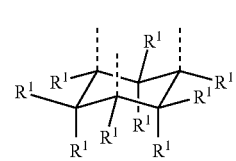

formula (8)

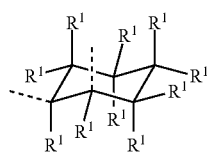

formula (9)

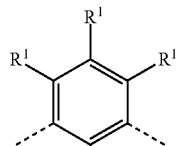

formula (10)

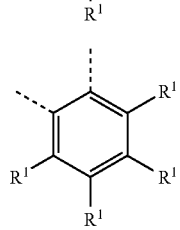

formula (11)

formula (12)
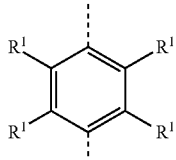

formula (13)
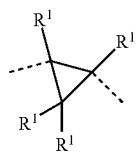

formula (14)
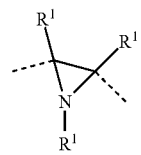

formula (15)
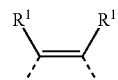

formula (16)
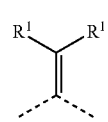

formula (17)
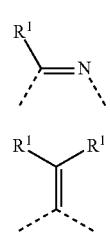

where the dashed bonds in each case indicate the bonding to Y;

n is 1, 2, or 3;

m is 1 or 2; and wherein said metal complex of formula (1) is uncharged.

2. The electronic device of claim 1, comprising an anode, a cathode and at least one layer, wherein said layer comprises at least one organic or organometallic compound, where said organic electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, and organic laser diodes.

3. The electronic device of claim 1, wherein the substituents R form a chain-shaped, branched or mono- or polycyclic, aliphatic, aromatic and/or benzo-fused structure with one another and/or together with the ligand L, and the ligands thus have a polydentate or polypodal ligand character.

4. The electronic device of claim 1, wherein the number of atoms in the groups Y and in the group V or Z which represent the direct connection between the isonitrile groups or between the isonitrile group and the ligand group L is between 6 and 12 atoms.

5. The electronic device of claim 1, wherein the ligands are selected from ligands of the formulae (18) to (28), each of which may be substituted by one or more radicals $R^1$:

formula (18)
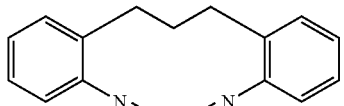

formula (19)
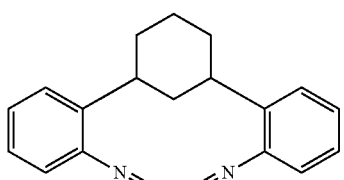

formula (20)
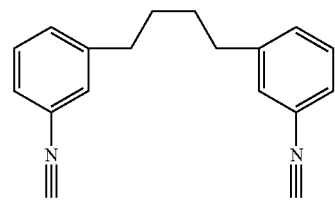

formula (21)
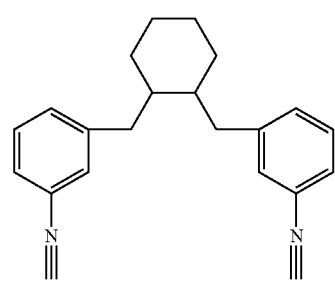

formula (22)
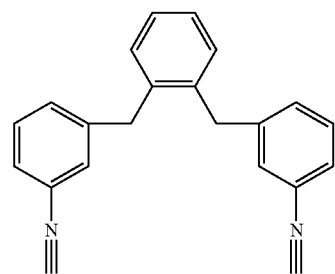

formula (23)
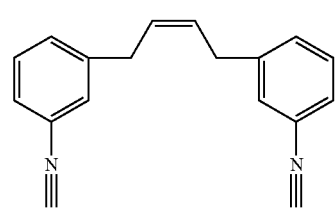

formula (24)
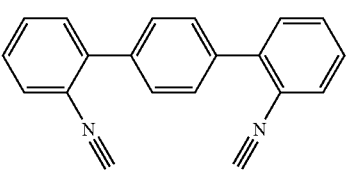

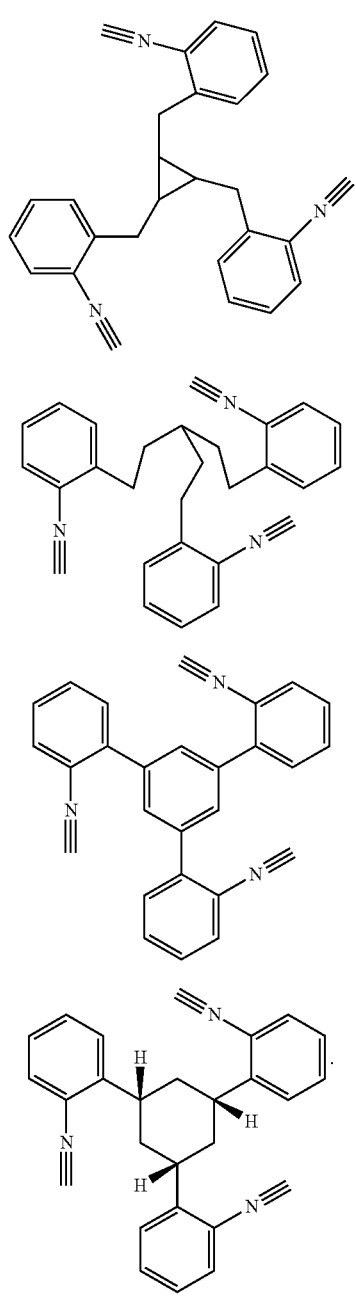

formula (25)

formula (26)

formula (27)

formula (28)

6. The electronic device of claim 1, wherein the ligands L are selected from the group consisting of carbon monoxide, nitrogen monoxide, amines, phosphines, phosphites, arsines, stibines, nitrogen-containing heterocycles, carbenes, hydride, deuteride, the halides F, Cl, Br and I, alkylacetylides, arylacetylides, cyanide, azide, cyanate, isocyanate, thiocyanate, isothiocyanate, aliphatic or aromatic alcoholates, aliphatic or aromatic thioalcoholates, amides, carboxylates, aryl groups, anionic, nitrogen-containing heterocycles, $O^{2-}$, $S^{2-}$, carbides, which result in coordination in the form R—C≡M, and nitrenes, which result in coordination in the form R—N=M, where R generally stands for a substituent, or $N^{3-}$, diamines, imines, diimines, heterocycles containing two nitrogen atoms, diphosphines, 1,3-diketonates derived from 1,3-diketones, 3-ketonates derived from 3-ketoesters, carboxylates derived from aminocarboxylic acids, salicyliminates derived from salicylimines, dialcoholates derived from dialcohols, dithiolates derived from dithiols, borates of nitrogen-containing heterocycles, $\eta^5$-cyclopentadienyl, $\eta^5$-pentamethylcyclopentadienyl, $\eta^6$-benzene or $\eta^7$-cycloheptatrienyl, each of which may be substituted by one or more radicals $R^1$, or in that the ligand L is a bidentate monoanionic ligand which, with the metal, forms a cyclo-metallated five- or six-membered ring with at least one metal-carbon bond, in particular a combination of two groups, as represented by the formulae (29) to (56), where one group is bonded via a neutral nitrogen atom or a carbene atom and the other group is bonded via a negatively charged carbon atom or a negatively charged nitrogen atom, where the ligand L is then formed from the groups of the formulae (29) to (56) through these groups bonding to one another in each case at the position denoted by #, and the position at which the groups coordinate to the metal is denoted by *:

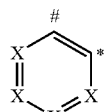

formula (29)

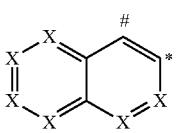

formula (30)

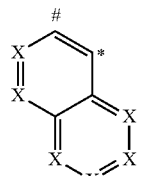

formula (31)

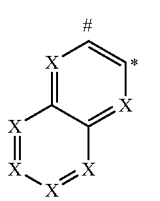

formula (32)

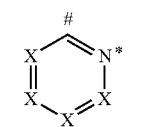

formula (33)

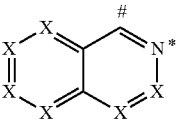

formula (34)

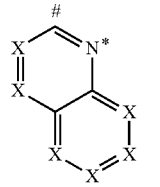

formula (35)

formula (36)
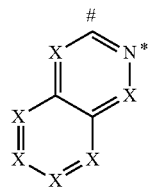
formula (37)
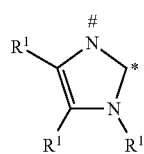
formula (38)
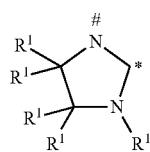
formula (39)
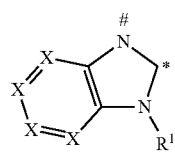
formula (40)
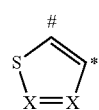
formula (41)
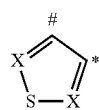
formula (42)
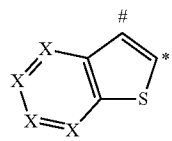
formula (43)
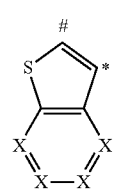
formula (44)
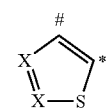
formula (45)
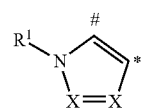
formula (46)
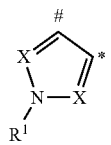
formula (47)
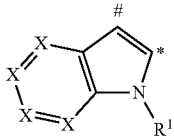
formula (48)
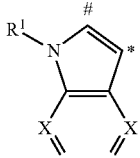
formula (49)
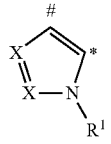
formula (50)
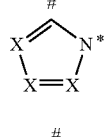
formula (51)
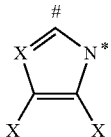
formula (52)
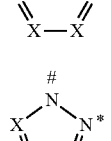
formula (53)
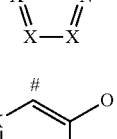
formula (54)
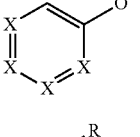
formula (55)
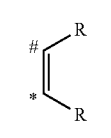
formula (56)
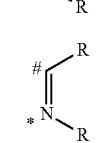

and X stands, identically or differently on each occurrence, for $CR^1$ or N, with the proviso that a maximum of three symbols X in each group stand for N;

or in that the ligand L is a 1,3,5-cis-cyclohexane derivative, in particular of the formula (57), a 1,1,1-tri(methylene) methane derivative, in particular of the formula (58), or a 1,1,1-trisubstituted methane, in particular of the formulae (59) and (60):

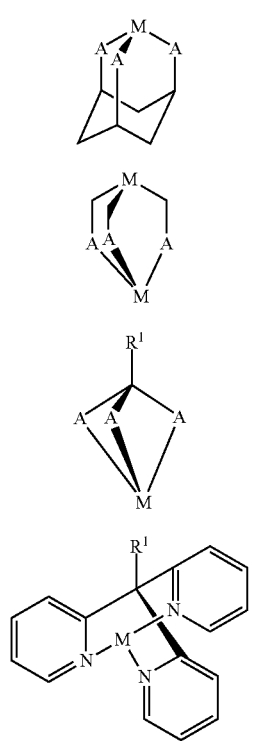

formula (57)

formula (58)

formula (59)

formula (60)

where the coordination to the metal M is shown in each of the formulae, and A stands, identically or differently on each occurrence, for $O^-$, $S^-$, $COO^-$, $P(R^1)_2$ or $N(R^1)_2$.

7. The electronic device of claim 1, wherein said electronic device is an electroluminescent device comprising a cathode, an anode and one or more emitting layers and in addition optionally in each case one or more hole-injection layers, hole-transport layers, hole-blocking layers, electron-transport layers, electron-injection layers, exciton-blocking layers, charge-generation layers and/or organic or inorganic p/n junctions, wherein the compound of the formula (1) is employed as emission material in an emitting layer.

8. The electronic device of claim 1, wherein said electronic device is an electroluminescent device and wherein the compound of formula (1) is employed in an emitting layer in combination with one or more matrix materials.

9. A process for producing the electronic device of claim 1, comprising applying one or more layers by means of a sublimation process, by means of the OVPD process, with the aid of carrier-gas sublimation, by means of the OVJP process, from solution, and/or by means of a printing process.

10. A compound of formula (1')

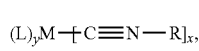

formula (1')

wherein

M is a penta- or hexacoordinated transition metal selected from the group consisting of chromium, molybdenum, tungsten, ruthenium, osmium, rhodium, iridium, nickel, platinum, copper, silver, and gold;

L is on each occurrence, identically or differently, a mono-, bi- or tridentate ligand which bonds to the metal M and is optionally substituted by one or more radicals $R^1$, and wherein L is also optionally bonded to the radical R of the isonitrile group;

R is on each occurrence, identically or differently, an organic substituent having 1 to 60 C atoms and optionally substituted by one or more substituents $R^1$; wherein a plurality of radicals R are also optionally linked to one another and thus form a polydentate ligand, and wherein the radical R may also be linked to the ligand L;

$R^1$ is on each occurrence, identically or differently, H, D, F, Cl, Br, I, $N(R^2)_2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkinyl, alkoxy or thioalkoxy group having 3 to 40 C atoms, each of which are optionally substituted by one or more radicals $R^2$, wherein one or more non-adjacent $CH_2$ groups are optionally replaced by $R^2C=CR^2$, C≡C, $Si(R^2)_2$, $Ge(R^2)_2$, $Sn(R^2)_2$, C=O, C=S, C=Se, C=$NR^2$, P(=O)($R^2$), SO, $SO_2$, $NR^2$, O, S or $CONR^2$, and wherein one or more H atoms are optionally replaced by D, F, Cl, Br, I, CN or $NO_2$, an aromatic or heteroaromatic ring system having 5 to 60 aromatic ring atoms optionally substituted by one or more radicals $R^2$, an aryloxy or heteroaryloxy group having 5 to 60 aromatic ring atoms optionally substituted by one or more radicals $R^2$, a diarylamino group, diheteroarylamino group or aryl-heteroarylamino group having 10 to 40 aromatic ring atoms optioanlly substituted by one or more radicals $R^2$, or a combination of these systems; and wherein two or more substituents $R^1$ optionally define a mono- or polycyclic aliphatic, aromatic and/or benzo-fused ring system with one another;

$R^2$ is on each occurrence, identically or differently, H, D, F or an aliphatic, aromatic and/or heteroaromatic hydrocarbon radical having 1 to 20 C atoms wherein one or more H atoms are optionally replaced by D or F; and wherein two or more substituents $R^2$ optionally define a mono- or polycyclic, aliphatic or aromatic ring system with one another;

x is 3, 4, 5 or 6;

y is 0, 1, 2 or 3, with the proviso that a coordination number on the metal of 5 or 6 is achieved, and at least one of the isonitrile ligands is selected from ligands of formula (27) or (28), each of which are optionally substituted by one or more radicals $R^1$:

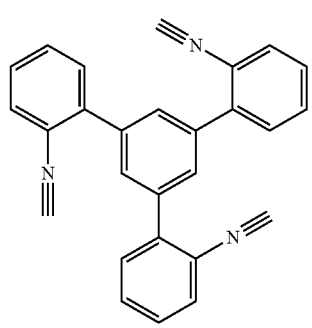

formula (27)

-continued

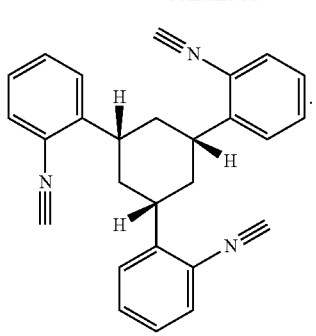

formula (28)

11. A compound of formula (27) or (28), each of which are optionally substituted by one or more radicals $R^1$,

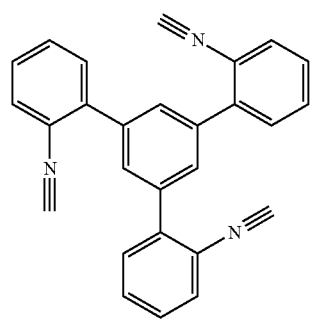

formula (27)

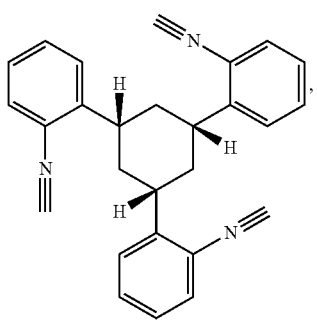

formula (28)

wherein $R^1$ is on each occurrence, identically or differently, H, D, F, Cl, Br, I, $N(R^2)_2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkinyl, alkoxy or thioalkoxy group having 3 to 40 C atoms, each of which are optionally substituted by one or more radicals $R^2$, wherein one or more non-adjacent $CH_2$ groups are optionally replaced by $R^2C=CR^2$, C≡C, $Si(R^2)_2$, $Ge(R^2)_2$, $Sn(R^2)_2$, C=O, C=S, C=Se, C=$NR^2$, P(=O)$(R^2)$, SO, $SO_2$, $NR^2$, O, S or $CONR^2$, and wherein one or more H atoms are optionally replaced by D, F, Cl, Br, I, CN or $NO_2$, an aromatic or heteroaromatic ring system having 5 to 60 aromatic ring atoms optionally substituted by one or more radicals $R^2$, an aryloxy or heteroaryloxy group having 5 to 60 aromatic ring atoms optionally substituted by one or more radicals $R^2$, a diarylamino group, diheteroarylamino group or aryl-heteroarylamino group having 10 to 40 aromatic ring atoms optioanlly substituted by one or more radicals $R^2$, or a combination of these systems; and wherein two or more substituents $R^1$ optionally define a mono- or polycyclic aliphatic, aromatic and/or benzo-fused ring system with one another; and $R^2$ is on each occurrence, identically or differently, H, D, F or an aliphatic, aromatic and/or heteroaromatic hydrocarbon radical having 1 to 20 C atoms wherein one or more H atoms are optionally replaced by D or F; and wherein two or more substituents $R^2$ optionally define a mono- or polycyclic, aliphatic or aromatic ring system with one another.

12. A solution or formulation comprising at least one compound of formula (1')

$$(L)_yM\text{---}[C≡N\text{---}R]_x,$$ formula (1')

wherein

M is a penta- or hexacoordinated transition metal selected from the group consisting of, osmium, rhodium, iridium, nickel, platinum, copper, silver, and gold;

L is on each occurrence, identically or differently, a mono-, bi- or tridentate ligand which bonds to the metal M and is optionally substituted by one or more radicals $R^1$, and wherein L is also optionally bonded to the radical R of the isonitrile group;

R is on each occurrence, identically or differently, an organic substituent having 1 to 60 C atoms and optionally substituted by one or more substituents $R^1$; wherein a plurality of radicals R are also optionally linked to one another and thus form a polydentate ligand, and wherein the radical R may also be linked to the ligand L;

$R^1$ is on each occurrence, identically or differently, H, D, F, Cl, Br, I, $N(R^2)_2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkinyl, alkoxy or thioalkoxy group having 3 to 40 C atoms, each of which are optionally substituted by one or more radicals $R^2$, wherein one or more non-adjacent $CH_2$ groups are optionally replaced by $R^2C=CR^2$, C≡C, $Si(R^2)_2$, $Ge(R^2)_2$, $Sn(R^2)_2$, C=O, C=S, C=Se, C=$NR^2$, P(=O)$(R^2)$, SO, $SO_2$, $NR^2$, O, S or $CONR^2$, and wherein one or more H atoms are optionally replaced by D, F, Cl, Br, I, CN or $NO_2$, an aromatic or heteroaromatic ring system having 5 to 60 aromatic ring atoms optionally substituted by one or more radicals $R^2$, an aryloxy or heteroaryloxy group having 5 to 60 aromatic ring atoms optionally substituted by one or more radicals $R^2$, a diarylamino group, diheteroarylamino group or aryl-heteroarylamino group having 10 to 40 aromatic ring atoms optioanlly substituted by one or more radicals $R^2$, or a combination of these systems; and wherein two or more substituents $R^1$ optionally define a mono- or polycyclic aliphatic, aromatic and/or benzo-fused ring system with one another;

$R^2$ is on each occurrence, identically or differently, H, D, F or an aliphatic, aromatic and/or heteroaromatic hydrocarbon radical having 1 to 20 C atoms wherein one or more H atoms are optionally replaced by D or F; and wherein two or more substituents $R^2$ optionally define a mono- or polycyclic, aliphatic or aromatic ring system with one another;

x is 3, 4, 5 or 6;

Y is 0, 1, 2 or 3, with the proviso that a coordination number on the metal of 5 or 6 is achieved; and wherein said compound of formula (1') is uncharged, and at least one organic solvent.

* * * * *